United States Patent
Kim et al.

(10) Patent No.: US 12,165,974 B2
(45) Date of Patent: Dec. 10, 2024

(54) SEMICONDUCTOR PACKAGE

(71) Applicant: Samsung Electronics Co., Ltd., Suwon-si (KR)

(72) Inventors: Won-Young Kim, Seoul (KR); Sunwon Kang, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 17/392,936

(22) Filed: Aug. 3, 2021

(65) Prior Publication Data

US 2022/0199529 A1 Jun. 23, 2022

(30) Foreign Application Priority Data

Dec. 22, 2020 (KR) .................. 10-2020-0181118

(51) Int. Cl.
| | |
|---|---|
| *H01L 23/31* | (2006.01) |
| *H01L 23/00* | (2006.01) |
| *H01L 23/528* | (2006.01) |
| *H01L 23/538* | (2006.01) |
| *H01L 25/065* | (2023.01) |

(52) U.S. Cl.
CPC .......... *H01L 23/5286* (2013.01); *H01L 23/31* (2013.01); *H01L 23/5389* (2013.01); *H01L 24/19* (2013.01); *H01L 25/0657* (2013.01); *H01L 2224/04105* (2013.01)

(58) Field of Classification Search
CPC . H01L 23/5286; H01L 23/31; H01L 23/5389; H01L 24/19; H01L 25/0657; H01L 2224/04105
See application file for complete search history.

(56) References Cited

U.S. PATENT DOCUMENTS

| | | | |
|---|---|---|---|
| 8,298,866 B1 | 10/2012 | Huemoeller et al. | |
| 9,502,391 B2 | 11/2016 | Kwon et al. | |
| 10,685,925 B2 | 6/2020 | Dobbins et al. | |
| 10,748,953 B2 | 8/2020 | Cho et al. | |
| 2007/0164431 A1 | 7/2007 | Lee et al. | |
| 2018/0211895 A1* | 7/2018 | Yang | H01L 24/11 |
| 2019/0267314 A1* | 8/2019 | Lee | H01L 25/117 |
| 2020/0091078 A1 | 3/2020 | Takahashi et al. | |
| 2020/0105544 A1* | 4/2020 | Tsai | H01L 21/4853 |

(Continued)

FOREIGN PATENT DOCUMENTS

| | | | |
|---|---|---|---|
| KR | 2007-0038378 A | 4/2007 | |
| KR | 100927762 B1 | 11/2009 | |

*Primary Examiner* — Trang Q Tran
(74) *Attorney, Agent, or Firm* — Harness, Dickey & Pierce, P.L.C.

(57) ABSTRACT

Disclosed is a semiconductor package including a semiconductor chip that includes a chip pad on one surface of the semiconductor chip, a redistribution pattern on the one surface of the semiconductor chip and electrically connected to the chip pad, and a photosensitive dielectric layer between the semiconductor chip and the redistribution pattern. The photosensitive dielectric layer may be in physical contact with the redistribution pattern. The redistribution pattern includes a signal redistribution pattern, a ground redistribution pattern, and a power redistribution pattern. A vertical distance between the chip pad and the signal redistribution pattern may be greater than a width of the signal redistribution pattern.

17 Claims, 17 Drawing Sheets

(56) References Cited

U.S. PATENT DOCUMENTS

| | | | |
|---|---|---|---|
| 2020/0111742 A1* | 4/2020 | Han | H01L 24/19 |
| 2020/0176407 A1* | 6/2020 | Lee | H01L 23/49838 |
| 2020/0185314 A1 | 6/2020 | Kim | |
| 2020/0194348 A1 | 6/2020 | Choi et al. | |
| 2020/0211967 A1 | 7/2020 | Nakano | |
| 2020/0365517 A1* | 11/2020 | Lin | H01L 23/3114 |
| 2021/0020574 A1* | 1/2021 | Yu | H01L 25/0652 |

\* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2020-0181118 filed on Dec. 22, 2020 in the Korean Intellectual Property Office, the disclosure of which is hereby incorporated by reference in its entirety.

BACKGROUND

Inventive concepts relate to a semiconductor package, and more particularly, to a semiconductor package including a redistribution substrate and a method of fabricating the same.

A semiconductor package is provided to implement an integrated circuit chip to qualify for use in electronic products. Typically, a semiconductor package includes a semiconductor chip mounted on a printed circuit board (PCB) and bonding wires or bumps may be used to electrically connect the semiconductor chip to the printed circuit board. With the development of electronic industry, various research has been conducted to improve the reliability and durability of semiconductor packages.

SUMMARY

Some embodiments of inventive concepts provide a semiconductor package having increased reliability and durability and/or a method of fabricating the same.

According to some example embodiments of inventive concepts, a semiconductor package may include a semiconductor chip that includes a chip pad on one surface of the semiconductor chip; a redistribution pattern on the one surface of the semiconductor chip and electrically connected to the chip pad; and a photosensitive dielectric layer between the semiconductor chip and the redistribution pattern. The photosensitive dielectric layer may be in physical contact with the redistribution pattern. The redistribution pattern may include a signal redistribution pattern, a ground redistribution pattern, and a power redistribution pattern. A vertical distance between the chip pad and the signal redistribution pattern may be greater than a width of the signal redistribution pattern.

According to some example embodiments of inventive concepts, a semiconductor package may include a semiconductor chip that includes a plurality of chip pads on one surface of the semiconductor chip; a plurality of upper redistribution patterns on the one surface of the semiconductor chip and electrically connected to corresponding chip pads among the plurality of chip pads; a photosensitive dielectric layer on the one surface of the semiconductor chip and covering the plurality of upper redistribution patterns; and a plurality of lower redistribution patterns on bottom surfaces of corresponding ones of the plurality of upper redistribution patterns and electrically connected to the corresponding ones of the plurality of upper redistribution patterns. The plurality of upper redistribution patterns may include a first signal redistribution pattern and a second signal redistribution pattern that are electrically isolated from each other. The plurality of lower redistribution patterns may include a first lower signal redistribution pattern coupled to the first signal redistribution pattern and a plurality of second lower signal redistribution patterns insulated from the first signal redistribution pattern. When viewed in plan, the first signal redistribution pattern may be spaced apart from the second lower signal redistribution.

According to some example embodiments of inventive concepts, a semiconductor package may include a semiconductor substrate; a circuit layer on one surface of the semiconductor substrate, the circuit layer including a plurality of integrated circuits, a plurality of silicon-based dielectric layers, and a plurality of wiring structures; a plurality of chip pads on the circuit layer and electrically connected through the plurality of wiring structures to the plurality of integrated circuits; a plurality redistribution patterns on the circuit layer and electrically connected to corresponding ones of the plurality of chip pads; a photosensitive dielectric layer on the circuit layer and covering at least a portion of each of the plurality of redistribution patterns; a plurality of redistribution pads on the photosensitive dielectric layer and coupled to corresponding ones of the plurality of redistribution patterns; and a plurality of solder patterns on bottom surfaces of corresponding ones of the plurality of redistribution pads and coupled to the corresponding ones of the plurality of redistribution pads. The plurality of redistribution patterns may include a plurality of signal redistribution patters, a ground redistribution pattern, and a power redistribution pattern. The plurality of redistribution pads may include a plurality of signal redistribution pads coupled to the plurality of signal redistribution patterns, a ground redistribution pad coupled to the ground redistribution pattern, and a power redistribution pad coupled to the power redistribution pattern. The photosensitive dielectric layer may include a photosensitive polymer. When viewed in plan, an interval between the plurality of signal redistribution patterns may be about 10 times to about 15 times of a width of the plurality of signal redistribution patterns.

DETAILED DESCRIPTION

Figure 1A:
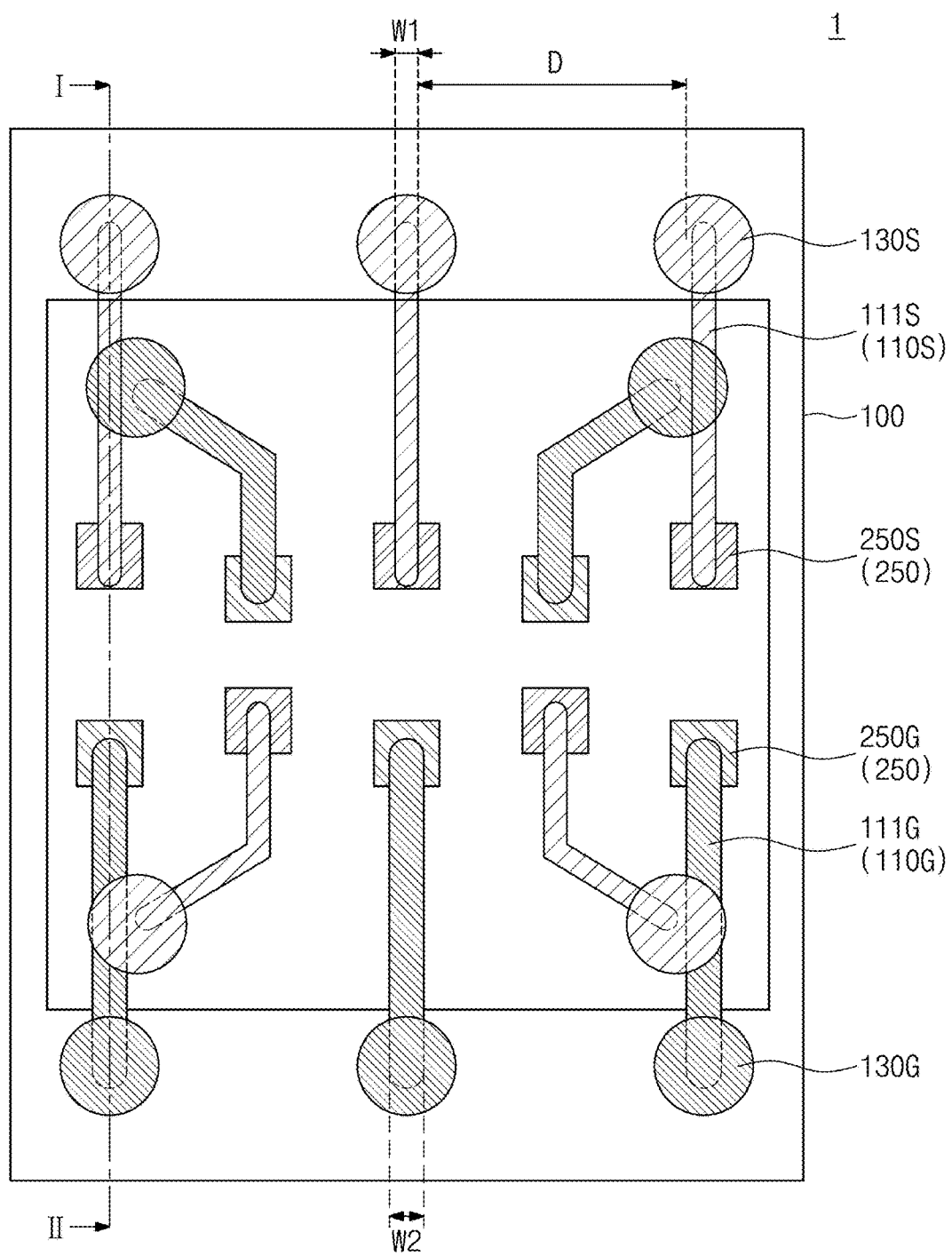
FIG. 1A illustrates a plan view showing a semiconductor package according to some example embodiments.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

In this description, like reference numerals may indicate like components. The following will now describe a semiconductor package and its fabricating method according to inventive concepts.

Figure 1B:
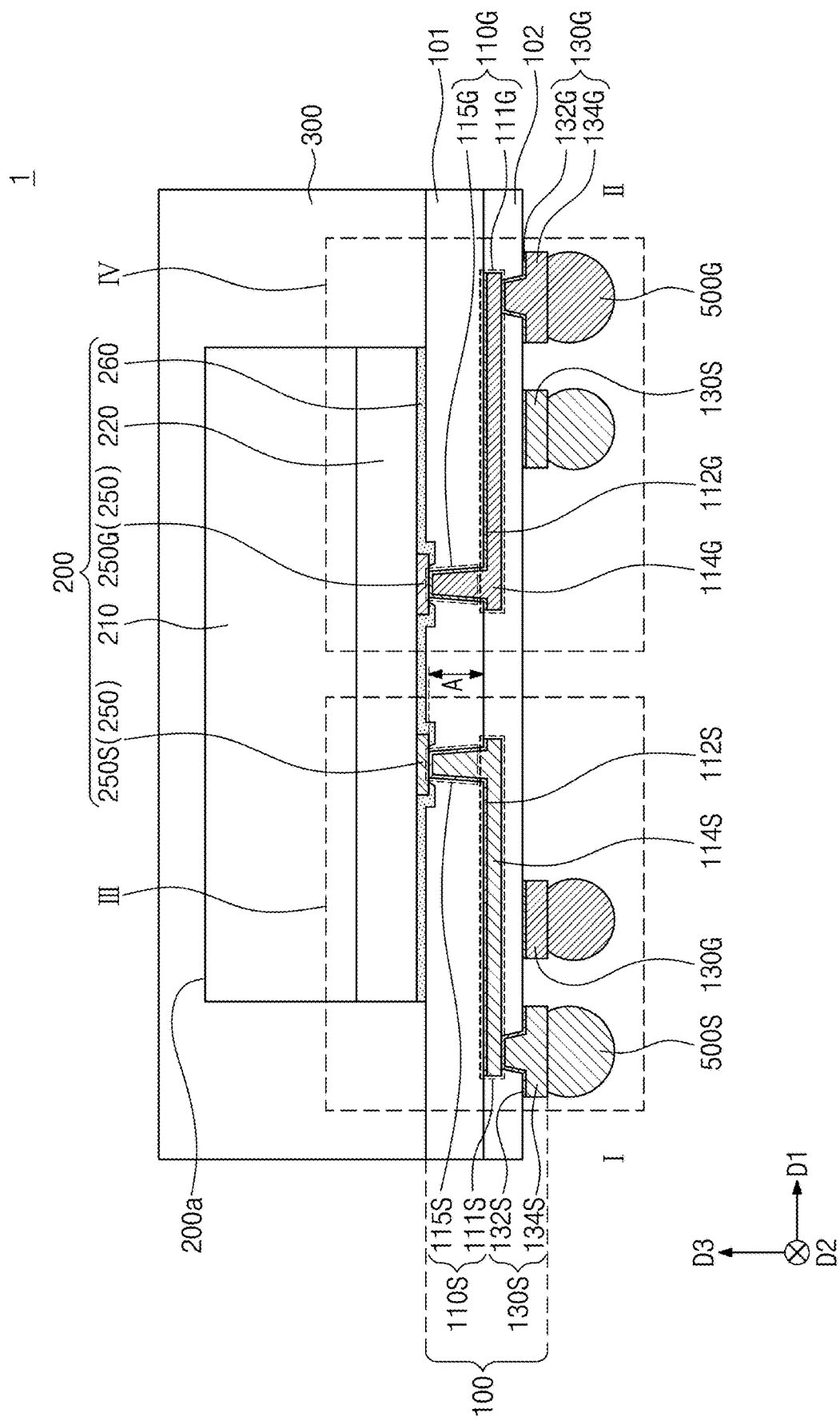
FIG. 1B illustrates a cross-sectional view taken along line I-II of FIG. 1A.
Figure 1C:
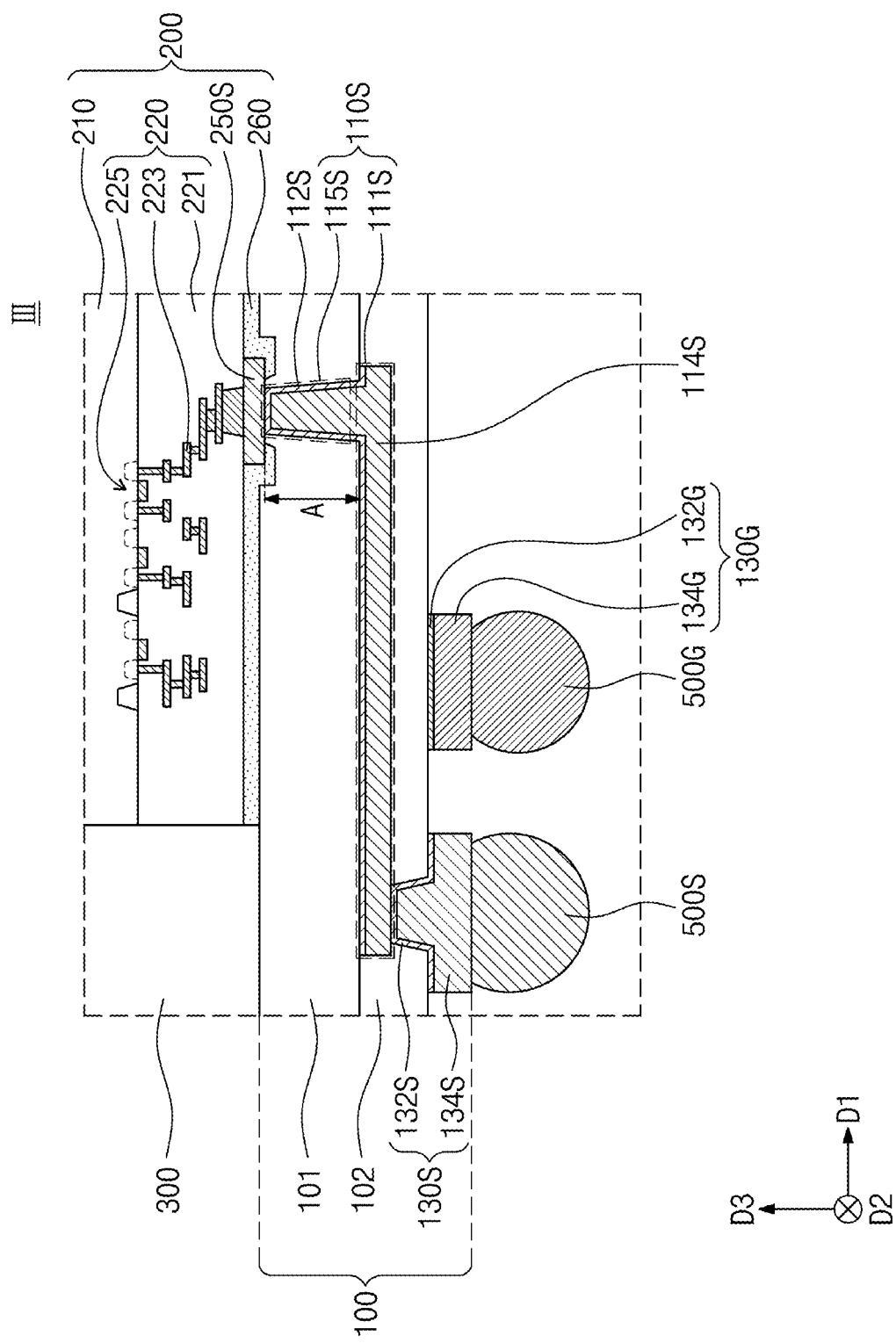
FIG. 1C illustrates an enlarged view showing section III of FIG. 1B.
Figure 1D:
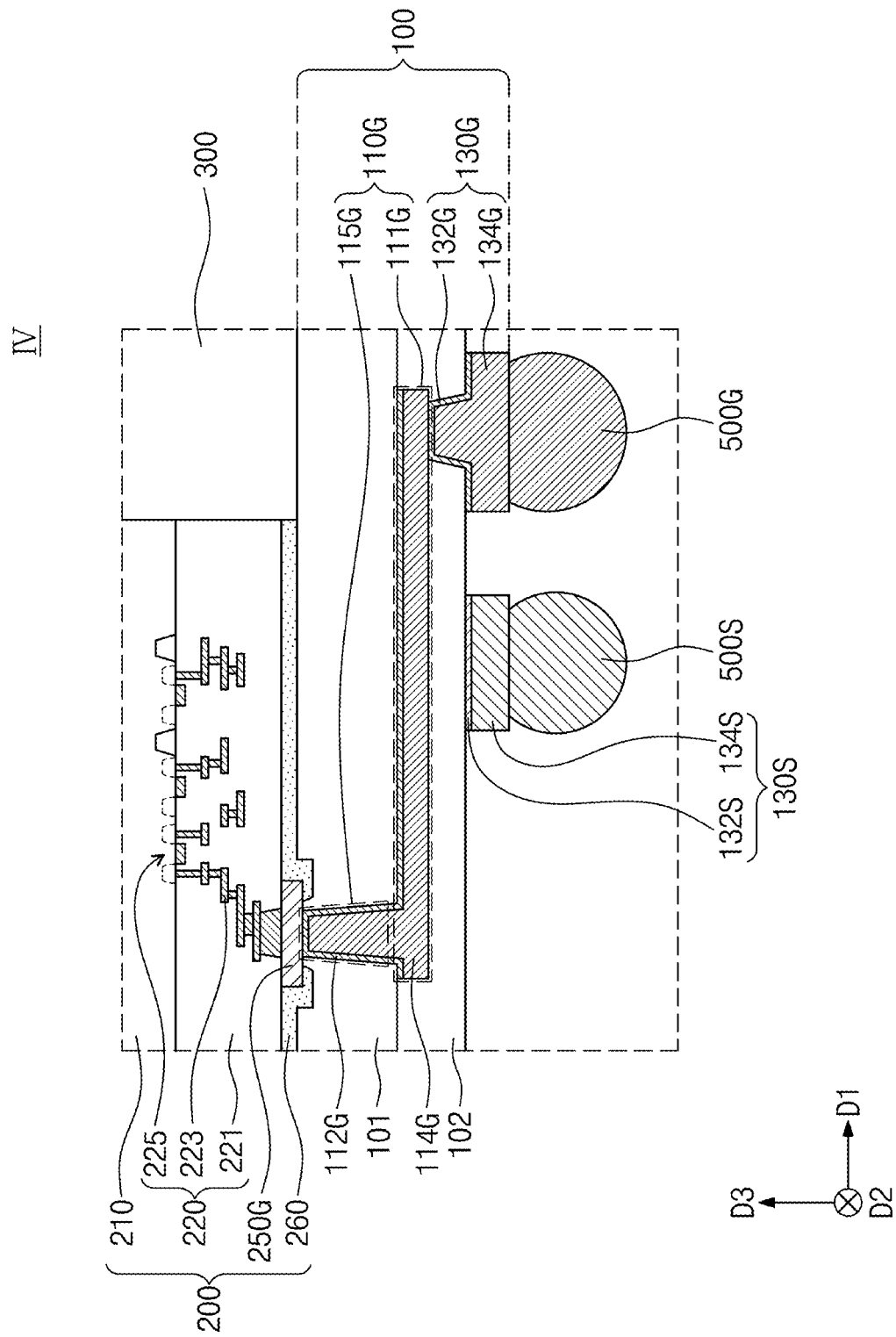
FIG. 1D illustrates an enlarged view showing section IV of FIG. 1B.

FIG. 1A illustrates a plan view showing a semiconductor package according to some example embodiments. FIG. 1B illustrates a cross-sectional view taken along line I-II of FIG. 1A. FIG. 1C illustrates an enlarged view showing section III of FIG. 1B. FIG. 1D illustrates an enlarged view showing section IV of FIG. 1B.

Referring to FIGS. 1A, 1B, 1C, and 1D, a semiconductor package 1 may include a redistribution substrate 100, a semiconductor chip 200, a molding layer 300, and solder patterns 500S and 500G. The redistribution substrate 100 may have a top surface and a bottom surface that face each other.

The semiconductor chip 200 may be mounted on the top surface of the redistribution substrate 100. The semiconductor chip 200 may include a semiconductor substrate 210, a circuit layer 220, chip pads 250, and a passivation layer 260. The semiconductor substrate 210 may include a semiconductor material, such as silicon, germanium, or silicon-germanium. The circuit layer 220 may be provided on a bottom surface of the semiconductor substrate 210. As illustrated in FIGS. 1C and 1D, the circuit layer 220 may include a dielectric layer 221, integrated circuits 225, and wiring structures 223. The integrated circuits 225 may be provided on the bottom surface of the semiconductor substrate 210. The integrated circuits 225 may include, for example, transistors. The integrated circuits 225 may include a memory circuit, a logic circuit, or a combination thereof. The dielectric layer 221 may be provided on the bottom surface of the semiconductor substrate 210, and may cover the integrated circuits 225. The dielectric layer 221 may include a plurality of layers. The dielectric layer 221 may include silicon-based dielectric layers. The dielectric layer 221 may include a silicon-containing dielectric material, such as one or more of silicon oxide, silicon nitride, silicon oxynitride, and tetraethyl orthosilicate (TEOS).

The wiring structures 223 may be provided in the dielectric layer 221. The wiring structures 223 may be electrically connected to the integrated circuits 225. The wiring structures 223 may include line parts and via parts. In this description, the phrase "electrically connected/coupled" may include "directly connected/coupled" or "indirectly connected/coupled through other conductive component(s)." The phrase "electrically connected to the semiconductor chip 200" may mean "electrically connected to the integrated circuits 225."

The chip pads 250 may be exposed on one surface of the semiconductor chip 200. The one surface may be a bottom surface of the semiconductor chip 200. For example, the chip pads 250 may be disposed on a bottom surface of the circuit layer 220. The chip pads 250 may be electrically connected through the wiring structures 223 to the integrated circuits 225. The phrase "a certain component is connected to the chip pads 250" may mean that the certain component is coupled to the semiconductor chip 200. The chip pads 250 may include metal, such as aluminum.

The chip pads 250 may include first chip pads 250S and second chip pads 250G. The second chip pads 250G may be disposed laterally spaced apart from and electrically isolated from the first chip pads 250S. The first chip pads 250S may be signal chip pads. For example, the first chip pads 250S may include a command/address (C/A) signal chip pad and a data (DQ) signal chip pad. The second chip pads 250G may have their functions different from those of the first chip pads 250S. The second chip pads 250G may include a ground chip pad and a power chip pad. The second chip pads 250G may further include a differential signal chip pad and a direct current signal chip pad.

The passivation layer 260 may be provided on the bottom surface of the semiconductor chip 200. For example, the passivation layer 260 may be provided on the bottom surface of the circuit layer 220, and may cover a bottom surface of the dielectric layer 221. The passivation layer 260 may have pad openings, which pad openings may correspondingly expose bottom surfaces of the chip pads 250. For example, the pad openings of the passivation layer 260 may correspondingly expose central portions of the bottom surfaces of the chip pads 250. The passivation layer 260 may further cover sidewalls of the chip pads 250 and edge portions of the bottom surfaces of the chip pads 250. The passivation layer 260 may include a different material from that of the dielectric layer 221. For example, the passivation layer 260 may include an organic dielectric material. The passivation layer 260 may include a polymer, such as polyimide. The passivation layer 260 may include non-photosensitive polymer.

The redistribution substrate 100 may include a first organic dielectric layer 101, a second organic dielectric layer 102, conductive patterns 110S and 110G, and redistribution pads 130S and 130G. The first organic dielectric layer 101 may be provided on the bottom surface of the semiconductor chip 200, and may cover a bottom surface of the passivation layer 260. For example, the first organic dielectric layer 101 may be in direct contact with the bottom surface of the passivation layer 260. The first organic dielectric layer 101 may expose the chip pads 250. The first organic dielectric layer 101 may include a different material from that of the passivation layer 260. The first organic dielectric layer 101 may be a photosensitive dielectric layer. For example, the first organic dielectric layer 101 may include a photosensitive polymer. In this description, the photosensitive polymer may include, for example, at least one selected from photosensitive polyimide, polybenzoxazole, phenolic polymers, and benzocyclobutene polymers.

The conductive patterns 110S and 110G may include signal conductive patterns 110S and ground/power conductive patterns 110G. The conductive patterns 110S and 110G may be disposed on a bottom surface of the first organic dielectric layer 101 and electrically connected to corresponding chip pads 250. The signal conductive patterns 110S may serve as paths along which command/address (C/A) or data (DQ) signals are transmitted. The signal conductive patterns 110S may not be used to transmit differential signals and direct current signals.

The ground/power conductive patterns 110G may be disposed spaced apart from and electrically isolated from the signal conductive patterns 110S. The ground/power conductive patterns 110G may have different functions from that of the signal conductive patterns 110S. The ground/power conductive patterns 110G may include a ground conductive pattern and a power conductive pattern. The ground/power conductive patterns 110G may further include a direct current conductive pattern.

Each of the signal conductive patterns 110S may include a signal redistribution pattern 111S and a signal via part 115S. The signal redistribution pattern 111S may be disposed on the bottom surface of the first organic dielectric layer 101. The signal redistribution pattern 111S may include a command/address signal redistribution pattern and a data signal redistribution pattern. The signal via part 115S may be disposed between a corresponding first chip pad 250S and the signal redistribution pattern 111S. The signal via part 115S may be provided in the first organic dielectric layer 101. The signal via part 115S may have a top surface at a higher level than that of a top surface of the signal redistribution pattern 111S. In this description, a via part of a certain conductive component may be a portion for vertical connection. A redistribution pattern may be a portion for horizontal connection. When a certain component includes a via part and a redistribution pattern, the redistribution pattern may have a length (or width) greater than that of the via part.

Each of the ground/power conductive patterns 110G may include a ground/power redistribution pattern 111G and a ground/power via part 115G. The ground/power redistribution pattern 111G may include a ground redistribution pattern and a power redistribution pattern. The ground/power redistribution pattern 111G may be disposed on the bottom surface of the first organic dielectric layer 101. The ground/power via part 115G may be provided in the first organic dielectric layer 101, and may be disposed between a corresponding second chip pad 250G and the ground/power redistribution pattern 111G.

Each of the signal conductive patterns 110S may include a first seed pattern 112S and a first conductive layer 114S. For one of the signal conductive patterns 110S, each of the signal redistribution pattern 111S and the signal via part 115S may include the first seed pattern 112S and the first conductive layer 114S. The first conductive layer 114S of the signal via part 115S may be connected, with no boundary, to the first conductive layer 114S of the signal redistribution pattern 111S. The first seed pattern 112S of the signal via part 115S may be connected, with no boundary, to the first seed pattern 112S of the signal redistribution pattern 111S. The first seed pattern 112S may be interposed between the first conductive layer 114S and the first organic dielectric layer 101 and between the first conductive layer 114S and a corresponding first chip pad 250S. Then first seed pattern 112S may extend onto neither a lower sidewall nor a bottom surface of the first conductive layer 114S. The lower sidewall of the first conductive layer 114S may correspond to a sidewall of the signal redistribution pattern 111S. The first seed pattern 112S may have a thickness less than that of the first conductive layer 114S. The first conductive layer 114S may include metal, such as copper. The first seed pattern 112S may further include a metallic material different from that of the first conductive layer 114S, but inventive concepts are not limited thereto. For example, the first seed pattern 112S may include copper, titanium, or an alloy thereof.

Each of the ground/power conductive patterns 110G may include a second seed pattern 112G and a second conductive layer 114G. For one of the ground/power conductive patterns 110G, each of the ground/power redistribution pattern 111G and the ground/power via part 115G may include the second seed pattern 112G and the second conductive layer 114G. The second seed pattern 112G of the ground/power via part 115G may be connected, with no boundary, to the second seed pattern 112G of the ground/power redistribution pattern 111G. The second conductive layer 114G of the ground/power via part 115G may be connected, with no boundary, to the second conductive layer 114G of the ground/power redistribution pattern 111G. The second seed pattern 112G may be interposed between the second conductive layer 114G and the first organic dielectric layer 101 and between the second conductive layer 114G and a corresponding second chip pad 250G. The second seed pattern 112G may have a thickness less than that of the second conductive layer 114G. The second conductive layer 114G may include the same material as that of the first conductive layer 114S. The second seed pattern 112G may include the same material as that of the first seed pattern 112S.

As shown in FIG. 1A, when viewed in plan, the signal redistribution patterns 111S may be disposed spaced apart from each other. The signal redistribution patterns 111S may have their widths W1 that are measured in a direction that intersects a direction of major axes of the signal redistribution patterns 111S. The signal redistribution patterns 111S may have their lengths that are measured in a direction parallel to a direction of major axes of the signal redistribution patterns 111S. For example, ones of the signal redistribution patterns 111S may have their major axes that extend in a direction parallel to a first direction D1. The width W1 of the signal redistribution patterns 111S may be measured in a second direction D2. The first direction D1 may be substantially parallel to a top surface 200a of the semiconductor chip 200. The second direction D2 may be substantially parallel to the top surface 200a of the semiconductor chip 200, and may intersect the first direction D1. A third direction D3 may be substantially perpendicular to the top surface 200a of the semiconductor chip 200. The top surface 200a may face the bottom surface of the semiconductor chip 200.

The signal redistribution patterns 111S may be spaced apart from each other in a direction parallel to the second direction D2. An interval D between the signal redistribution patterns 111S may be greater than the width W1 of the signal redistribution patterns 111S. The interval D between the signal redistribution patterns 111S may be a distance between neighboring ones of the signal redistribution patterns 111S that transmit signals of the same kind. For example, the neighboring signal redistribution patterns 111S may be data signal redistribution patterns that are adjacent to each other. Alternatively, the neighboring signal redistribution patterns 111S may be command/address signal redistribution patterns that are adjacent to each other. The distance may be a minimum distance. The interval D between the signal redistribution patterns 111S may be about 10 times to about 15 times of the width W1 of the signal redistribution patterns 111S. Because the interval D between the signal redistribution patterns 111S is equal to or greater than about 10 times of the width W1 of the signal redistribution patterns 111S, interference may be suppressed or avoided between the signal redistribution patterns 111S. The interference may include crosstalk or coupling noise. Therefore, the semiconductor package 1 may increase in reliability. Because the interval D between the signal redistribution patterns 111S is equal to or less than about 15 times of the width W1 of the signal redistribution patterns 111S, the redistribution substrate 100 may become highly integrated. Accordingly, the semiconductor package 1 may have compactness and high integration.

The width W1 of the signal redistribution patterns 111S may be different from a width W2 of the ground/power redistribution patterns 111G. For example, the width W1 of the signal redistribution patterns 111S may be less than the width W2 of one of the ground/power redistribution patterns 111G.

The conductive patterns 110S and 110G may be upper conductive patterns. The signal redistribution patterns 111S may be upper signal redistribution patterns, and the ground/power redistribution patterns 111G may be upper ground/power redistribution patterns. The redistribution patterns 111S and 111G may include the signal redistribution patterns 111S and the ground/power redistribution patterns 111G.

According to some example embodiments, as discussed below in FIG. 6, a semiconductor module may be fabricated by mounting the semiconductor package 1 on a board. The board may be a printed circuit board. A reduction in impedance between the semiconductor package 1 and the board may increase electrical characteristics of the semiconductor module. According to some example embodiments, an increase in vertical distance A between the signal redistribution patterns 111S and the chip pads 250 may reduce a difference in impedance between the semiconductor package 1 and a printed circuit board. In this case, the signal redistribution patterns 111S may be uppermost redistribution patterns. According to some example embodiments, the vertical distance (see A of FIGS. 1B and 1C) between the chip pads 250 and the signal redistribution patterns 111S may be greater than the width (see W1 of FIG. 1A) of the signal redistribution patterns 111S. Therefore, a difference in impedance may be reduced between the semiconductor package 1 and a printed circuit board. The semiconductor module may increase in electrical characteristics.

The vertical distance A between the chip pads 250 and the signal redistribution patterns 111S may be the same as a difference in level between the bottom surfaces of the chip pads 250 and the top surfaces of the signal redistribution patterns 111S. The top surface of the signal redistribution pattern 111S may correspond to that of a corresponding first seed pattern 112S of the signal redistribution patterns 111S. In this description, the term "vertical distance" between two certain components may indicate a difference in vertical level between the two certain components. The language "level" may mean "vertical level", and the expression "difference in level" may be measured in a direction parallel to the third direction D3.

The first organic dielectric layer 101 may be interposed between and in direct contact with the semiconductor chip 200 and the signal redistribution patterns 111S. For example, the first organic dielectric layer 101 may be in direct contact with the bottom surface of the passivation layer 260 and with the first seed pattern 112S of each of the signal redistribution patterns 111S. The first organic dielectric layer 101 may be interposed between and in direct contact with the semiconductor chip 200 and the ground/power redistribution patterns 111G. The first organic dielectric layer 101 may have a thickness greater than the width W1 of the signal redistribution patterns 111S. The thickness of the first organic dielectric layer 101 may be measured in a direction parallel to the third direction D3.

The second organic dielectric layer 102 may be provided on the bottom surface of the first organic dielectric layer 101 and bottom surfaces of the conductive patterns 110S and 110G, and may cover the signal redistribution patterns 111S and the ground/power redistribution patterns 111G. The second organic dielectric layer 102 may be a photosensitive dielectric layer. For example, the second organic dielectric layer 102 may include a photosensitive polymer the same as that of the first organic dielectric layer 101. In this case, the second organic dielectric layer 102 and the first organic dielectric layer 101 may be connected with no boundary, but inventive concepts are not limited thereto.

The redistribution pads 130S and 130G may be disposed on a bottom surface of the second organic dielectric layer 102, and may be electrically connected to corresponding conductive patterns 110S and 110G. The redistribution pads 130S and 130G may include signal redistribution pads 130S and ground/power redistribution pads 130G. For example, each of the signal redistribution pads 130S may transmit a command/address signal or a data signal. The signal redistribution pads 130S may transmit neither differential signals nor direct current signals. The signal redistribution pads 130S may be coupled to corresponding signal redistribution patterns 111S. The signal redistribution pads 130S may be insulated from the ground/powder redistribution patterns 111G. The ground/power redistribution pads 130G may be disposed spaced apart from and electrically insulated from the signal redistribution pads 130S. The ground/power redistribution pads 130G may be coupled to corresponding ground/power redistribution patterns 111G, and may be insulated from the signal redistribution patterns 111S. The ground/power redistribution pads 130G may include a ground pad and a power pad. The ground pad may be coupled to the ground redistribution pattern of the ground/power redistribution patterns 111G, and the power pad may be coupled to the power redistribution pattern of the ground/power redistribution patterns 111G. The ground/power redistribution pads 130G may further include a direct current signal pad.

In some example embodiments, the redistribution pads 130S and 130G may be lower redistribution patterns. For example, the signal redistribution pads 130S may be called lower signal redistribution patterns, and the ground/power redistribution pads 130G may be called lower ground/power redistribution patterns.

Each of the signal redistribution pads 130S may include a first pad seed pattern 132S and a first conductive pad 134S. The first conductive pad 134S may be provided in the second organic dielectric layer 102 and on the bottom surface of the second organic dielectric layer 102. The first pad seed pattern 132S may be interposed between the second organic dielectric layer 102 and the first conductive pad 134S and between the signal redistribution pattern 111S and the first conductive pad 134S. The first pad seed pattern 132S may have a thickness less than that of the first conductive pad 134S. The first pad seed pattern 132S may further include a metallic material different from that of the first conductive pad 134S, but inventive concepts are not limited thereto. For example, the first conductive pad 134S may include copper, nickel, gold, or an alloy thereof. The first pad seed pattern 132S may include copper, titanium, or any alloy thereof.

Each of the ground/power redistribution pads 130G may include a second pad seed pattern 132G and a second conductive pad 134G. The second conductive pad 134G may be provided in the second organic dielectric layer 102 and on the bottom surface of the second organic dielectric layer 102. The second pad seed pattern 132G may be interposed between the second organic dielectric layer 102 and the second conductive pad 134G and between the ground/power redistribution pattern 111G and the second conductive pad 134G. The second pad seed pattern 132G may have a thickness less than that of the second conductive pad 134G. The second pad seed pattern 132G may include the same material as that of the first pad seed pattern 132S. The second conductive pad 134G may include the same material as that of the first conductive pad 134S.

Because the redistribution patterns 111S and 111G are provided, an arrangement of the redistribution pads 130S and 130G may be freely designed without being limited to an arrangement of the chip pads 250. For example, at least one of the redistribution pads 130S and 130G may not be vertically aligned with the chip pad 250 that is connected thereto. As shown in FIG. 1A, when viewed in plan, the redistribution pads 130S and 130G may be disposed spaced apart from the chip pads 250. The redistribution pads 130S and 130G may have a pitch different from that of the chip pads 250.

Referring to FIGS. 1A and 1B, when viewed in plan, each of the signal redistribution patterns 111S may overlap the signal redistribution pad 130S that is electrically connected thereto. Each of the signal redistribution patterns 111S may be disposed spaced apart from the signal redistribution pads 130S that are not coupled thereto. Therefore, noise coupling or signal interference may be limited and/or prevented between the signal redistribution patterns 111S and the signal redistribution pads 130S. For example, the signal redistribution patterns 111S may include a first signal redistribution pattern and second signal redistribution patterns. The first signal redistribution pattern may be spaced apart from and electrically isolated from the second signal redistribution patterns. The signal redistribution pads 130S may include a first signal redistribution pad and second signal redistribution pads. The first signal redistribution pad may be provided on a bottom surface of the first signal redistribution pattern, and may be coupled to the first signal redistribution pattern. The second signal redistribution pads may be correspondingly coupled to the second signal redistribution patterns. The second signal redistribution pads may be electrically isolated from the second signal redistribution pattern. When viewed in plan, the first signal redistribution pattern may be spaced apart from the second signal redistribution pads. The first signal redistribution pattern may overlap none of the second signal redistribution pads. Therefore, signal interference may be suppressed or avoided between the first signal redistribution pattern and the second signal redistribution pads.

No crosstalk may occur between the signal redistribution patterns 111S and the ground/power redistribution pads 130G. Alternatively, even when crosstalk occurs between the signal redistribution patterns 111S and the ground/power redistribution pads 130G, the semiconductor package 1 may not decrease in reliability. According to some example embodiments, when viewed in plan, at least one of the signal redistribution patterns 111S may overlap at least one of the ground/power redistribution pads 130G. Therefore, the redistribution patterns 111S and 111G may become highly integrated, and the semiconductor package 1 may become compact-sized. When viewed in plan, another of the ground/power redistribution patterns 111G may overlap another of the signal redistribution pads 130S. Accordingly, the redistribution substrate 100 may become more highly integrated.

When the signal redistribution pattern 111S has signal paths whose lengths are different from each other, a delay time may be present between signals that are transmitted. The lengths of signal paths of the signal redistribution patterns 111S may correspond to extending lengths of the signal redistribution patterns 111S. When viewed in plan, the extending length of each of the signal redistribution patterns 111S may correspond to a path length between the signal via part 115S and the signal redistribution pad 130S that is electrically connected to the signal redistribution pad 130S. For example, one of the signal redistribution patterns 111S may have a linear shape when viewed in plan. The one of the signal redistribution patterns 111S may have opposite ends that are aligned in the second direction D2, and the signal redistribution pattern 111S may extend in the second direction D2. In this case, the extending length of the signal redistribution pattern 111S may correspond to a length in the second direction D2 of the signal redistribution pattern 111S.

On the other hand, another of the signal redistribution patterns 111S may have a bent shape when viewed in plan. In this case, the another signal redistribution pattern 111S may have a plurality of pieces, and the plurality of pieces may have their major axes that extend in different directions. The another signal redistribution pattern 111S may have an extending length that corresponds to a sum of lengths in major-axis directions of the plurality of pieces. For example, when viewed in plan, the another signal redistribution pattern 111S may have a first segment and a second segment. The first segment may have a major axis parallel to the second direction D2. The second segment may have a major axis parallel to a fourth direction (not designated by a reference numeral) different from the second direction D2. In this case, the another signal redistribution pattern 111S may have an extending length that corresponds to a sum of a length in the second direction D2 of the first segment and a length in the fourth direction of the second segment. Still another of the signal redistribution patterns 111S may have a first segment, a second segment, and a third segment. The second segment may have a major axis parallel to a direction that intersects a major axis of the first segment. The third segment may have a major axis parallel to a direction that intersects the major axis of the first segment and the major axis of the second segment. In this case, the still another signal redistribution pattern 111S may have an extending length that corresponds to a sum of a length in a major-axis direction of the first segment, a length in a major-axis direction of the second segment, and a length in a major-axis direction of the third segment.

The signal redistribution patterns 111S may include a first sub-signal redistribution pattern and a second sub-signal redistribution pattern. The second sub-signal redistribution pattern may have an extending length that is about 95% to about 105% of an extending length of the first signal redistribution pattern. The second sub-signal redistribution pattern may transmit signals of the same kind as that of signals that the first sub-signal redistribution pattern. For example, the first sub-signal redistribution pattern may be a data signal redistribution pattern, and the second sub-signal redistribution pattern may be a data signal redistribution pattern. Alternatively, the first sub-signal redistribution pattern may be a command/address signal redistribution pattern, and the second sub-signal redistribution pattern may be a command/address signal redistribution pattern. Therefore, a delay time may be reduced between the signal redistribution patterns 111S. The semiconductor package 1 may have increased reliability.

As shown in FIG. 1B, the molding layer 300 may be provided on the top surface of the redistribution substrate 100, and may cover the semiconductor chip 200. The molding layer 300 may cover the first organic dielectric layer 101. The molding layer 300 may include a dielectric polymer, such as epoxy molding compound. The redistribution substrate 100 may be provide on a bottom surface of the molding layer 300, and at least one of the redistribution pads 130S and 130G may vertically overlap the molding layer 300. For example, at least one of the signal redistribution patterns 111S may vertically overlap the molding layer 300. At least one of the ground/power redistribution pads 130G may vertically overlap the molding layer 300. Therefore, an arrangement of the redistribution pads 130S and 130G may be less or little limited.

The solder patterns 500S and 500G may be provided on bottom surfaces of the redistribution pads 130S and 130G, respectively. The solder patterns 500S and 500G may include signal solder patterns 500S and ground/power solder patterns 500G. The signal solder patterns 500S may be correspondingly provided on the bottom surfaces of the signal redistribution pads 130S, and may be correspondingly coupled to the signal redistribution pads 130S. The signal solder patterns 500S may be electrically connected through the signal conductive patterns 110S to corresponding first chip pads 250S. The signal solder patterns 500S may serve as terminals through which data signals and/or command/address signals are input to or output from the semiconductor chip 200. Neither differential signals nor direct current signals may be applied to the signal solder patterns 500S.

The ground/power solder patterns 500G may be correspondingly provided on the bottom surfaces of the ground/power redistribution pads 130G, and may be correspondingly coupled to the ground/power redistribution pads 130G. The ground/power solder patterns 500G may be laterally spaced apart from and electrically isolated from the signal solder patterns 500S. The ground/power solder patterns 500G may be electrically connected through the ground/power conductive patterns 110G to corresponding second chip pads 250G.

For brevity, the following will describe a single signal redistribution pattern, a single ground/power solder pattern, a single signal redistribution pad, a single ground/power redistribution pad, a single signal solder pattern, and a single ground/power solder pad.

Figure 1E:
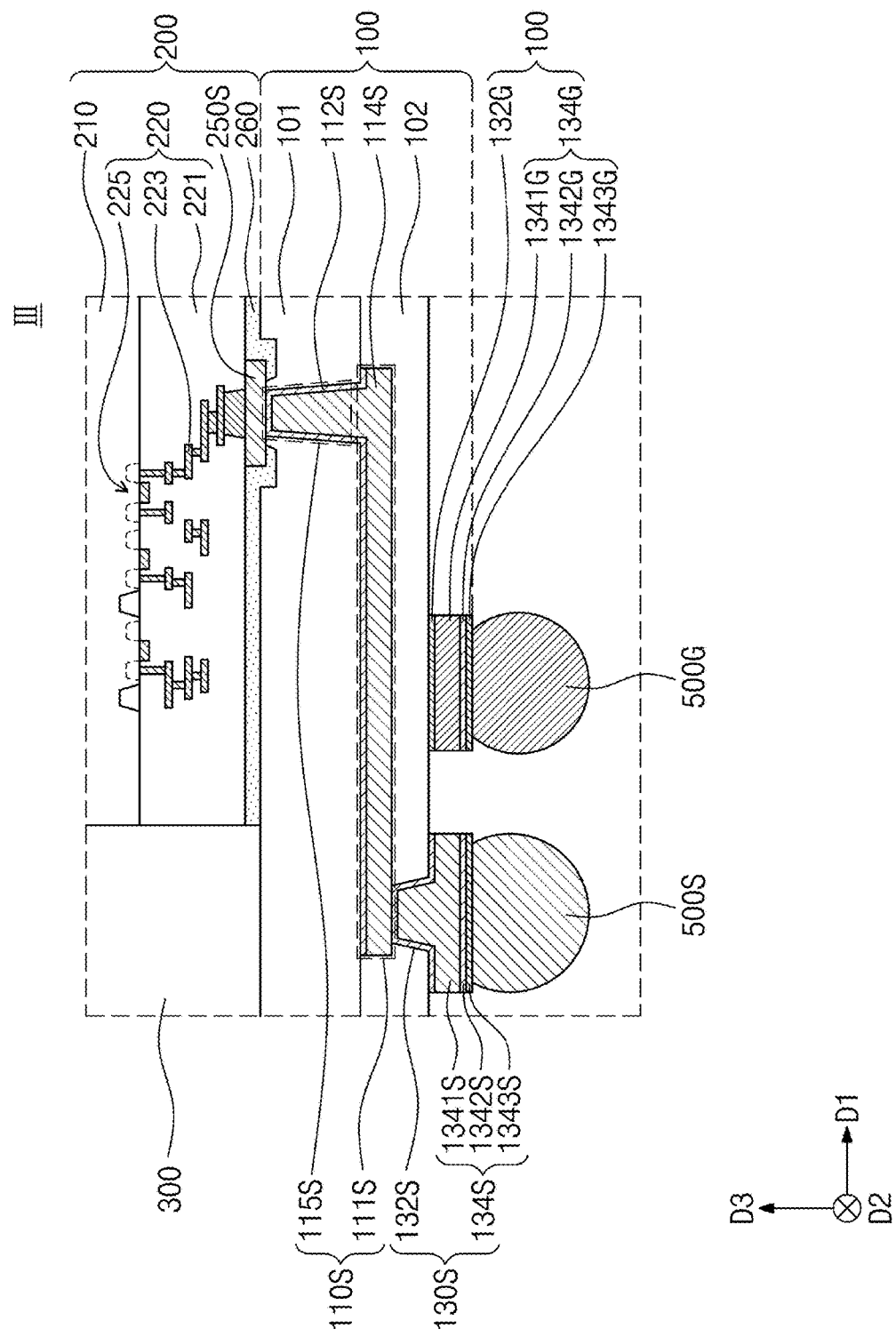
FIG. 1E illustrates a cross-sectional view showing redistribution pads according to some example embodiments.

FIG. 1E illustrates an enlarged cross-sectional view of section III depicted in FIG. 1B, showing redistribution pads according to some example embodiments.

Referring to FIG. 1C, the redistribution substrate 100 may include a first organic dielectric layer 101, a second organic dielectric layer 102, a signal conductive pattern 110S, a ground/power conductive pattern 110G, and redistribution pads 130S and 130G. The redistribution pads 130S and 130G may be substantially the same as those discussed above in FIG. 1E. For example, the signal redistribution pad 130S may include a first pad seed pattern 132S and a first conductive pad 134S.

In contrast, the first conductive pad 134S may include a first pad part 1341S, a second pad part 1342S, and a third pad part 1343S. The first pad part 1341S may be disposed on a bottom surface of the first pad seed pattern 132S. The first pad part 1341S may include a first metal, such as copper. The second pad part 1342S may be disposed on a bottom surface of the first pad part 1341S. The second pad part 1342S may be an adhesive layer. The second pad part 1342S may include a second metal different from the first metal of the first pad part 1341S. For example, the second metal may include nickel. The third pad part 1343S may be interposed between the second pad part 1342S and the solder patterns 500S and 500G. The third pad part 1343S may serve as a protection pad. For example, the third pad part 1343S may limit and/or limit oxidation of the first pad part 1341S. The third pad part 1343S may include a third metal different from the first metal and the second metal. The third metal may include, for example, gold. The second pad part 1342S may stably attach the third pad part 1343S to the first pad part 1341S.

The ground/power redistribution pad 130G may include a second pad seed pattern 132G and a second conductive pad 134G. The second conductive pad 134G may include a first pad layer 1341G, a second pad layer 1342G, and a third pad layer 1343G that are stacked. The first pad layer 1341G may be disposed on a bottom surface of the second pad seed pattern 132G. The first pad layer 1341G may include the first metal. The third pad layer 1343G may be interposed between the first pad layer 1341G and the ground/power solder pattern 500G. The third pad layer 1343G may serve as a protection pad. The third pad layer 1343G may include the third metal. The second pad layer 1342G may be interposed between the first pad layer 1341G and the third pad layer 1343G. The second pad layer 1342G may be an adhesive layer. The second pad layer 1342G may include the second metal.

Figure 2A:
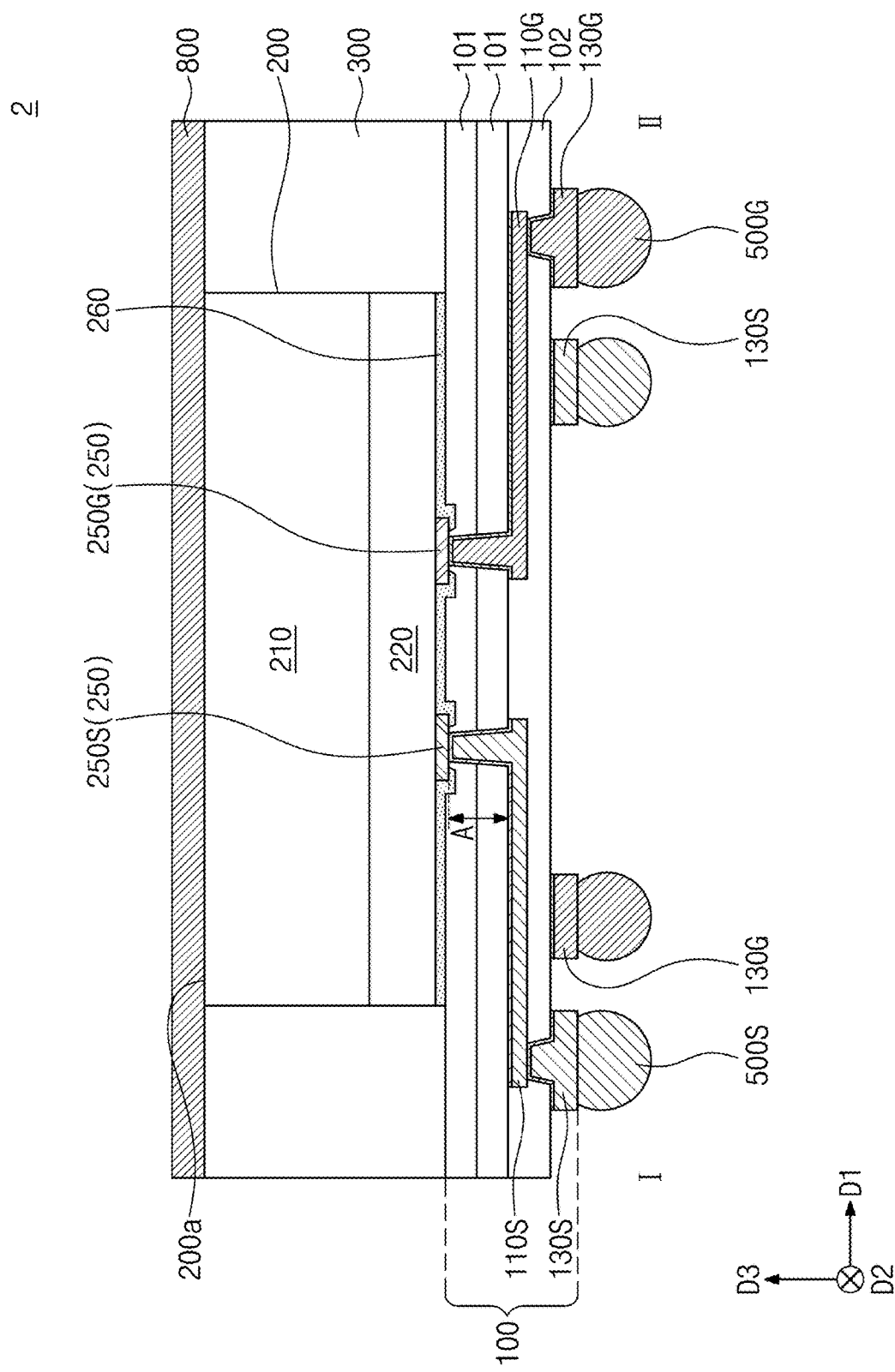
FIG. 2A illustrates a cross-sectional view showing a semiconductor package according to some example embodiments.

FIG. 2A illustrates a cross-sectional view taken along line I-II of FIG. 1A, showing a semiconductor package according to some example embodiments. The following description will refer to FIG. 1A together with FIG. 2A, and a duplicate explanation will be omitted.

Referring to FIG. 2A, a semiconductor package 2 may include a redistribution substrate 100, a semiconductor chip 200, a molding layer 300, solder patterns 500S and 500G, and a thermal radiation plate 800. The redistribution substrate 100, the semiconductor chip 200, the molding layer 300, and the solder patterns 500S and 500G may be identical or similar to those discussed above. For example, the molding layer 300 may be provided on the top surface of the redistribution substrate 100, and may cover sidewalls of the semiconductor chip 200. In contrast, the molding layer 300 may expose the top surface 200a of the semiconductor chip 200.

The thermal radiation plate 800 may be disposed on the top surface 200a of the semiconductor chip 200 and on a top surface of the molding layer 300. The thermal radiation plate 800 may include a heat sink, a heat slug, a thermal interface material (TIM) layer, or any combination thereof. The thermal radiation plate 800 may include a material of which thermal conductivity is high. The thermal radiation plate 800 may include metal, such as copper or aluminum. When the semiconductor package 2 operates, the thermal radiation plate 800 may promptly discharge heat produced from the semiconductor chip 200.

The redistribution substrate 100 may include a plurality of first organic dielectric layers 101, a plurality of second organic dielectric layers 102, a signal conductive pattern 110S, a ground/power conductive pattern 110G, and redistribution pads 130S and 130G. The second organic dielectric layer 102, the conductive patterns 110S and 110G, and the redistribution pads 130S and 130G may be substantially the same as those discussed above. In contrast, a plurality of first organic dielectric layers 101 may be interposed between the semiconductor chip 200 and the conductive patterns 110S and 110G. The stacking number of the first organic dielectric layers 101 may be variously changed. Each of the first organic dielectric layers 101 may include a photosensitive dielectric layer. An indistinct interface may be provided between the first organic dielectric layers 101, but inventive concepts are not limited thereto. The vertical distance A between the chip pad 250 and the signal redistribution pattern 111S may be greater than the width W1 of the signal redistribution pattern 111S illustrated in FIG. 1A. A sum of thicknesses of the first organic dielectric layers 101 may be greater than the width W1 of the signal redistribution pattern 111S.

Figure 2B:
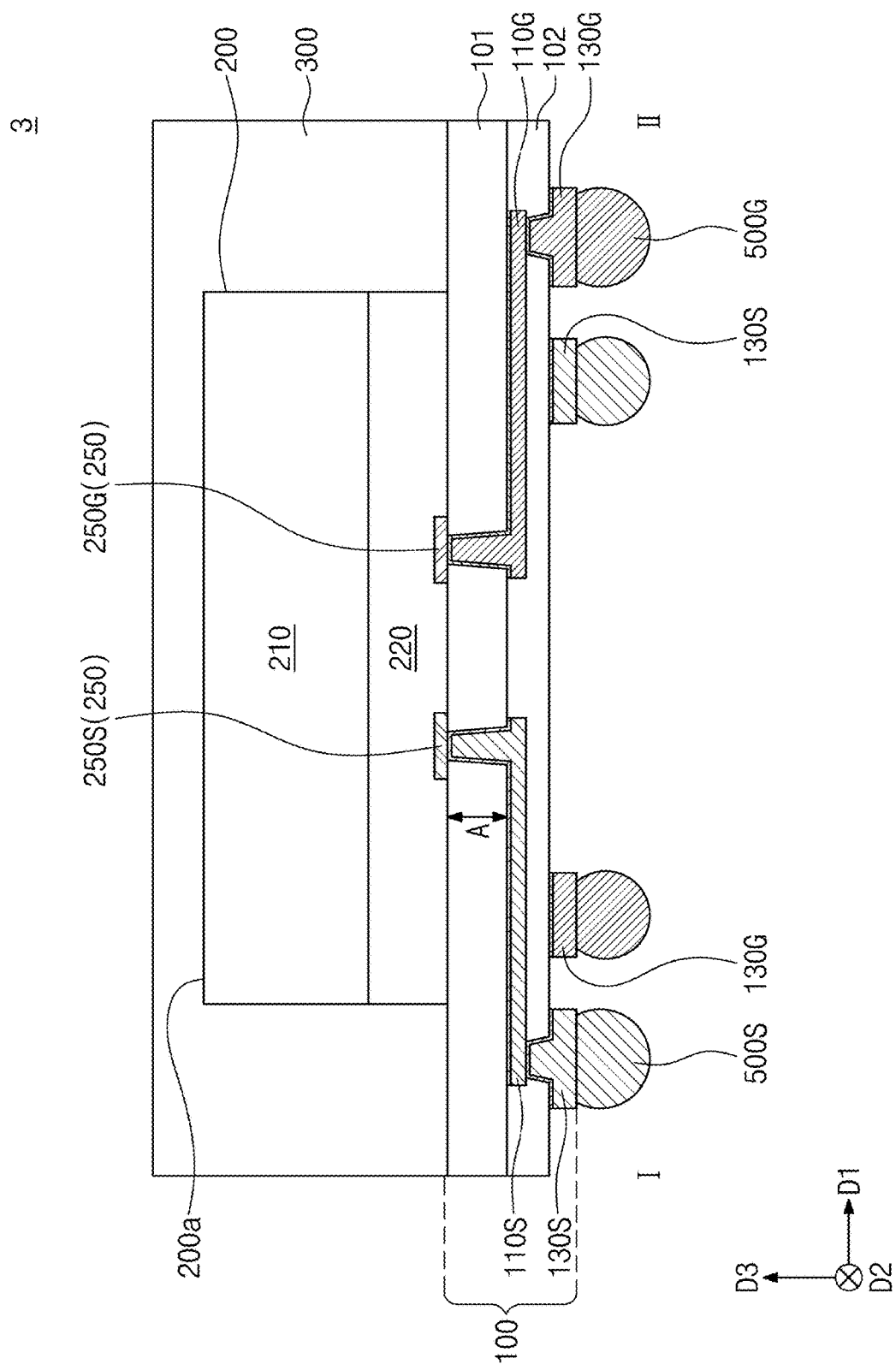
FIG. 2B illustrates a cross-sectional view showing a semiconductor package according to some example embodiments.

FIG. 2B illustrates a cross-sectional view taken along line I-II of FIG. 1A, showing a semiconductor package according to some example embodiments. The following description will refer to FIG. 1A together with FIG. 2B.

Referring to FIG. 2B, a semiconductor package 3 may include a redistribution substrate 100, a semiconductor chip 200, a molding layer 300, and solder patterns 500S and 500G. The semiconductor chip 200 may include a semiconductor substrate 210, a circuit layer 220, and chip pads 250. However, the semiconductor chip 200 may not include the passivation layer (see 260 of FIG. 1B). The circuit layer 220 of the semiconductor chip 200 may be directly in physical contact with the redistribution substrate 100. For example, the dielectric layer 221 of the circuit layer 220 discussed in the example of FIGS. 1C and 1D may be directly in physical contact with the first organic dielectric layer 101. The vertical distance A between the chip pads 250 and the signal redistribution pattern 111S may be greater than the width W1 of the signal redistribution pattern 111S discussed in FIG. 1A. The vertical distance A between the chip pads 250 and the signal redistribution pattern 111S may be substantially the same as a thickness of the first organic dielectric layer 101.

Figure 2C:
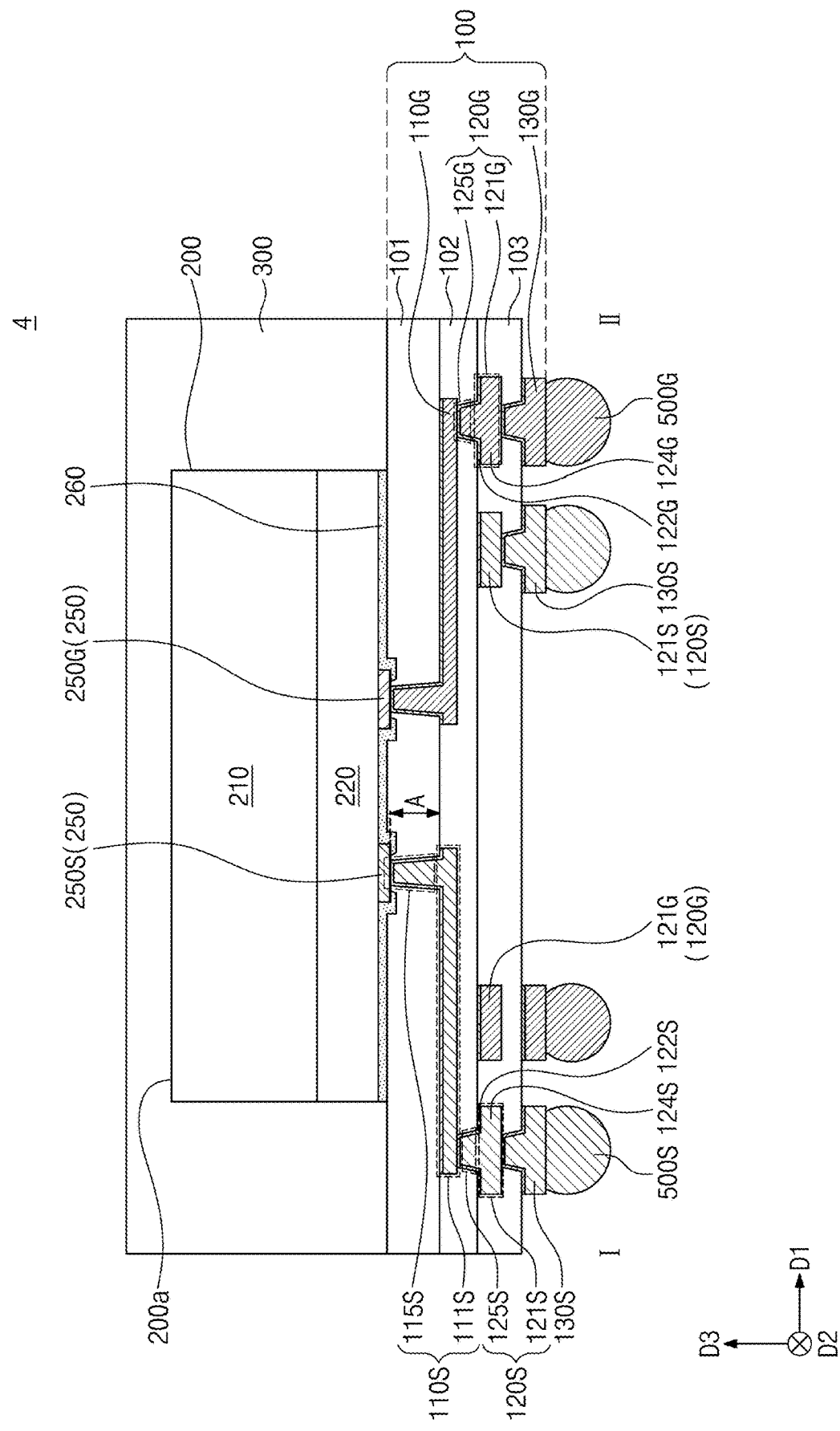
FIG. 2C illustrates a cross-sectional view showing a semiconductor package according to some example embodiments.

FIG. 2C illustrates a cross-sectional view taken along line I-II of FIG. 1A, showing a semiconductor package according to some example embodiments.

Referring to FIG. 2C, a semiconductor package 4 may include a redistribution substrate 100, a semiconductor chip 200, a molding layer 300, and solder patterns 500S and 500G. The redistribution substrate 100 may include a first organic dielectric layer 101, a second organic dielectric layer 102, a third organic dielectric layer 103, conductive patterns 110S and 110G, lower conductive patterns 120S and 120G, and redistribution pads 130S and 130G. The first organic dielectric layer 101, the conductive patterns 110S and 110G, and the redistribution pads 130S and 130G may be substantially the same as those discussed in the examples of FIGS. 1A to 1D. For example, the vertical distance A between the chip pads 250 and the signal redistribution pattern 111S may be greater than the width W1 of the signal redistribution pattern 111S discussed in FIG. 1A. The second organic dielectric layer 102 may be disposed on the bottom surface 2111 of the first organic dielectric layer 101. The redistribution pads 130S and 130G may not be provided in the second organic dielectric layer 102.

The lower conductive patterns 120S and 120G may be correspondingly interposed between the conductive patterns 110S and 110G and the redistribution pads 130S and 130G. The lower conductive patterns 120S and 120G may include a lower signal conductive pattern 120S and a lower ground/power conductive pattern 120G. The lower signal conductive pattern 120S may be provided between and coupled to the signal conductive pattern 110S and the signal redistribution pad 130S. The lower signal conductive pattern 120S may include a lower signal via part 125S and a lower signal redistribution pattern 121S. The lower signal via part 125S may be provided in the second organic dielectric layer 102, and may be in direct contact with the signal conductive pattern 110S. The lower signal redistribution pattern 121S may be disposed on the bottom surface of the second organic dielectric layer 102 and may be connected to the lower signal via part 125S.

Each of the lower signal conductive patterns 120S may include a third seed pattern 122S and a third conductive layer 124S. For example, for one of the lower signal conductive patterns 120S, each of the lower signal redistribution pattern 121S and the lower signal via part 125S may include the third seed pattern 122S and the third conductive layer 124S. The third seed pattern 122S may be interposed between the third conductive layer 124S and the second organic dielectric layer 102 and between the third conductive layer 124S and a corresponding signal redistribution pattern 111S. The third seed pattern 122S may have a thickness less than that of the third conductive layer 124S. The third conductive layer 124S may include metal, such as copper. The third seed pattern 122S may include a metallic material different from that of the third conductive layer 124S. For example, the third seed pattern 122S may include copper, titanium, or an alloy thereof.

The lower signal redistribution pattern 121S may include a plurality of lower signal redistribution patterns 121S that are electrically isolated from each other. The plurality of lower signal redistribution patterns 121S may be correspondingly coupled to a plurality of signal redistribution patterns 111S. When viewed in plan, each of the lower signal redistribution patterns 121S may overlap the signal redistribution pattern 111S electrically connected to the each of the lower signal redistribution patterns 121S. When viewed in plan, each of the lower signal redistribution patterns 121S may be spaced apart from the signal redistribution patterns 111S electrically isolated from the each of the lower signal redistribution patterns 121S. Therefore, noise coupling or signal interference may be limited and/or prevented between the signal redistribution patterns 111S and the lower signal redistribution patterns 121S.

The lower ground/power conductive pattern 120G may be spaced apart from and electrically insulated from the lower signal conductive patterns 120S. The lower ground/power conductive pattern 120G may be provided and coupled to the ground/power conductive pattern 110G and the ground/power redistribution pad 130G. The lower ground/power conductive pattern 120G may include a lower ground/power via part 125G and a lower ground/power redistribution pattern 121G. The lower ground/power via part 125G may be provided in the second organic dielectric layer 102, and may be in direct contact with the ground/power conductive pattern 110G. The lower ground/power redistribution pattern 121G may be disposed on the bottom surface of the second organic dielectric layer 102, and may be connected to the lower ground/power via part 125G.

Each of the lower ground/power conductive patterns 120G may include a fourth seed pattern 122G and a fourth conductive layer 124G. For example, one of the lower ground/power conductive patterns 120G, each of the lower ground/power redistribution pattern 121G and the lower ground/power via part 125G may include the fourth seed pattern 122G and the fourth conductive layer 124G. The fourth seed pattern 122G may be interposed between the fourth conductive layer 124G and the second organic dielectric layer 102 and between the fourth conductive layer 124G and a corresponding ground/power redistribution pattern 111G. The fourth seed pattern 122G may have a thickness less than that of the fourth conductive layer 124G. The fourth conductive layer 124G may include the same material as that of the third conductive layer 124S. The fourth seed pattern 122G may include the same material as that of the third seed pattern 122S.

The lower ground/power redistribution pattern 121G may include a plurality of lower ground/power redistribution patterns 121G that are electrically isolated from each other. When viewed in plan, at least one of the signal redistribution patterns 111S may overlap at least one of the lower ground/power redistribution patterns 121G. Accordingly, the redistribution substrate 100 may become highly integrated.

The third organic dielectric layer 103 may be provided on the bottom surface of the second organic dielectric layer 102, and may cover the lower signal redistribution patterns 121S and the lower ground/power redistribution patterns 121G. The third organic dielectric layer 103 may be a photosensitive dielectric layer. The third organic dielectric layer 103 may include a photosensitive polymer the same as that of the second organic dielectric layer 102. The third organic dielectric layer 103 and the second organic dielectric layer 102 may be connected with no boundary, but inventive concepts are not limited thereto.

The redistribution pads 130S and 130G may be disposed on a bottom surface of the third organic dielectric layer 103. The signal redistribution pads 130S may extend into the third organic dielectric layer 103, and may be correspondingly coupled to the lower signal redistribution patterns 121S. The ground/power redistribution pads 130G may extend into the third organic dielectric layer 103, and may be correspondingly coupled to the lower ground/power redistribution patterns 121G.

Figure 3:
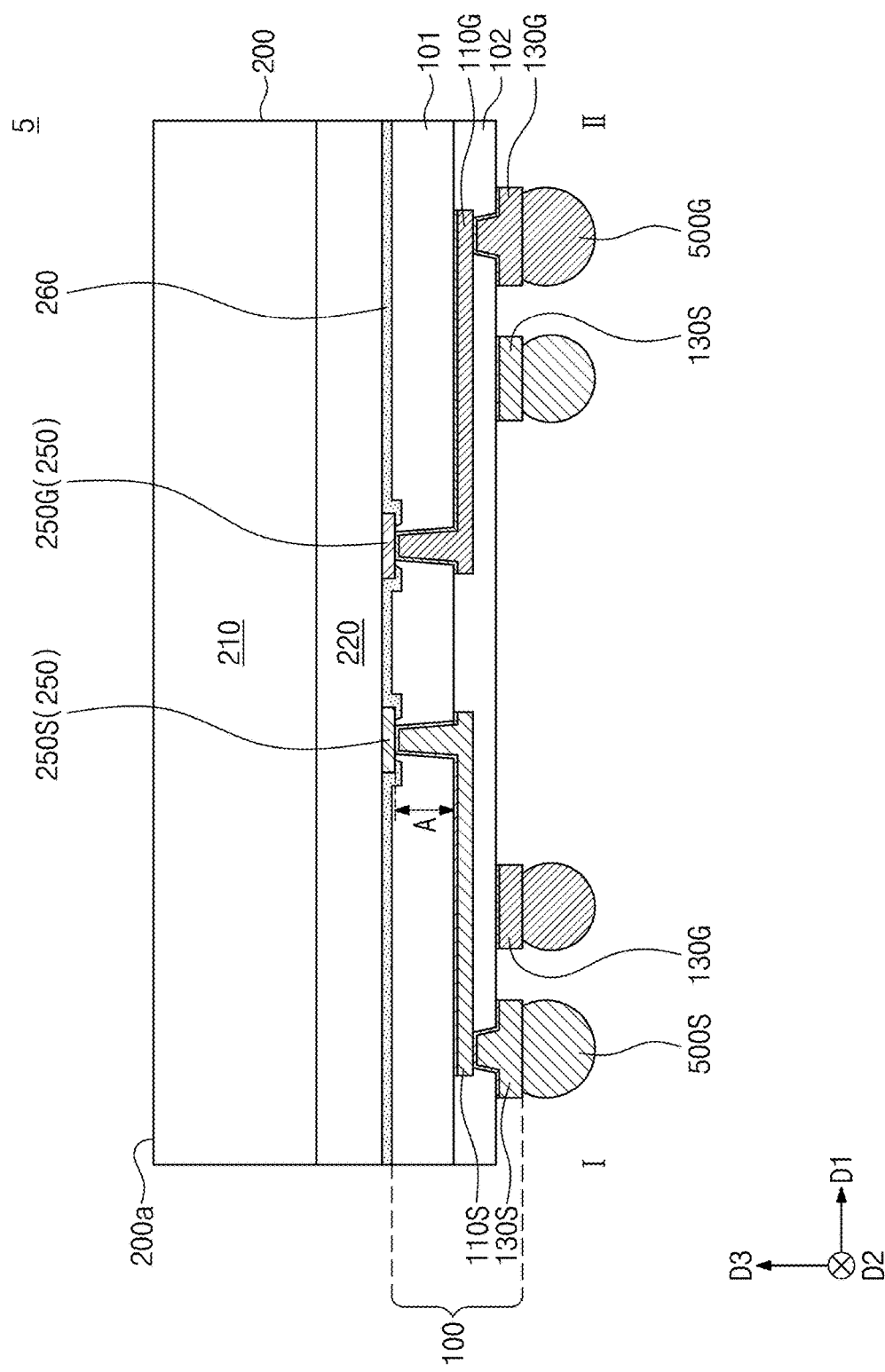
FIG. 3 illustrates a cross-sectional view showing a semiconductor package according to some example embodiments.

FIG. 3 illustrates a cross-sectional view taken along line I-II of FIG. 1A, showing a semiconductor package according to some example embodiments.

Referring to FIG. 3, a semiconductor package 5 may include a redistribution substrate 100, a semiconductor chip 200, and solder patterns 500S and 500G. The semiconductor package 5 may be a fan-in package. For example, the semiconductor package 5 may not include the molding layer 300 discussed in the example of FIG. 1B. The semiconductor chip 200 may have a width substantially the same as that of the redistribution substrate 100. The semiconductor chip 200 may have sidewalls that are correspondingly aligned with those of the redistribution substrate 100.

Figure 4A:
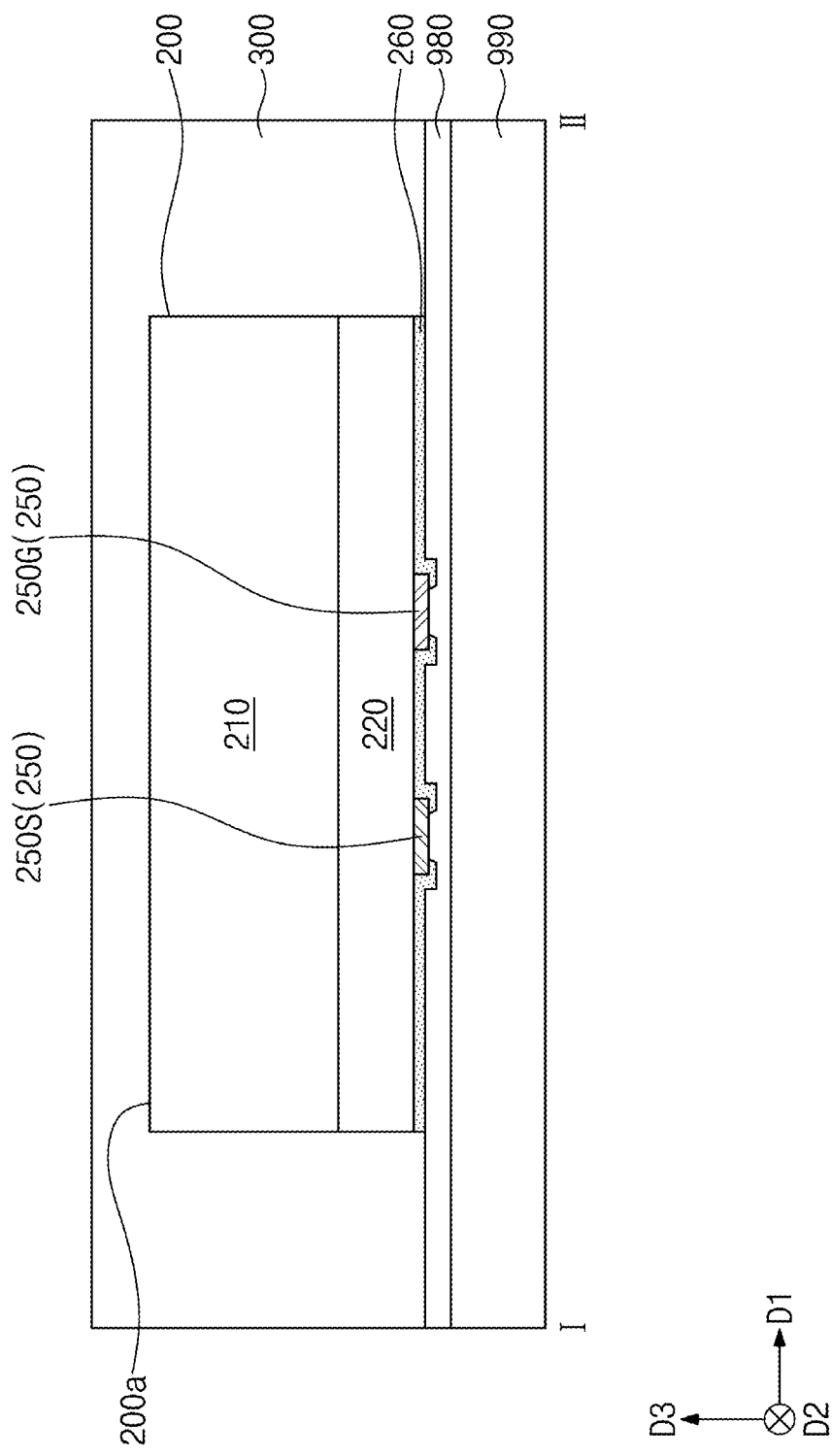
FIGS. 4A to 4E illustrate cross-sectional views showing a method of fabricating a semiconductor package according to some example embodiments.
Figure 4B:
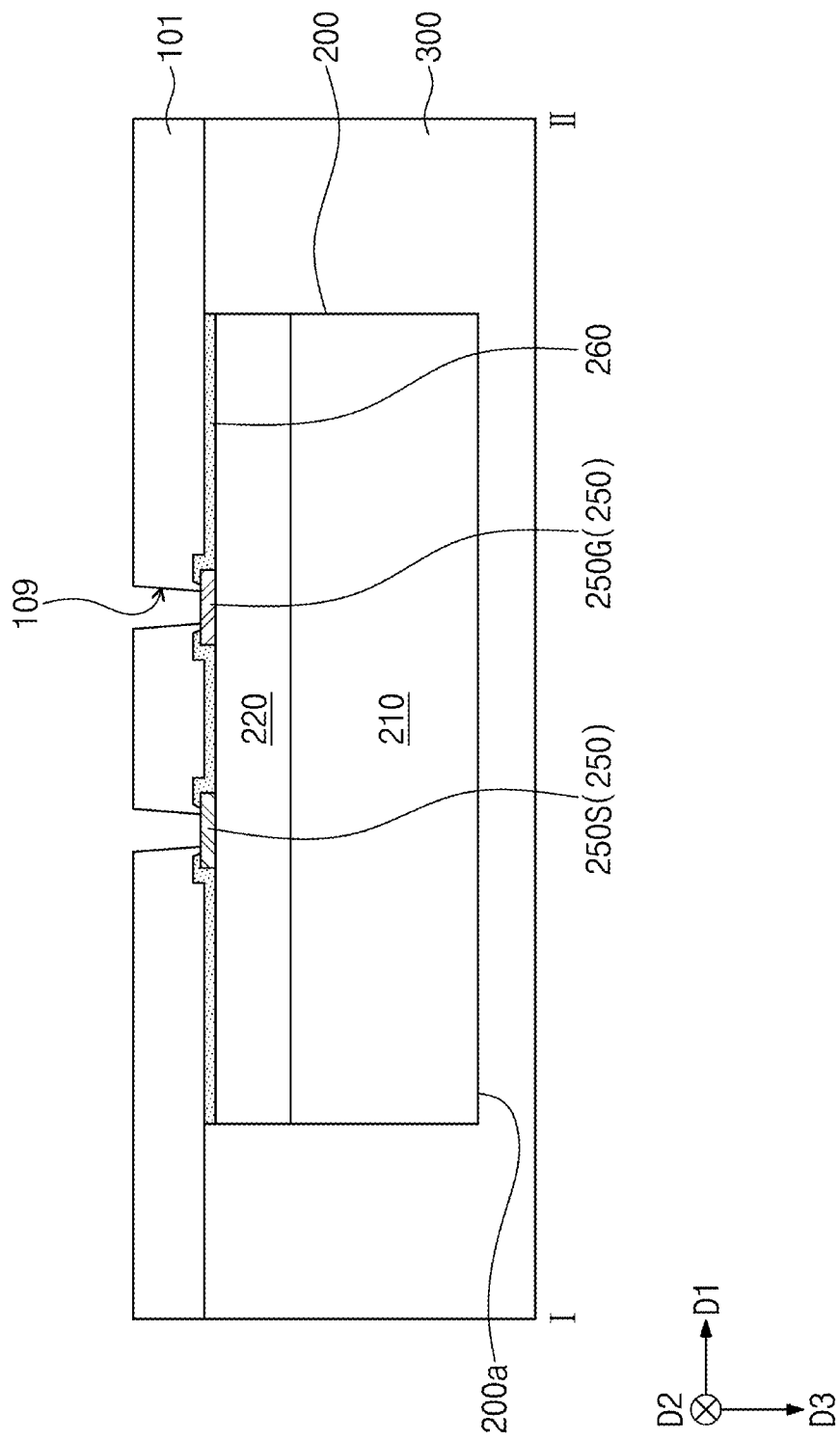
Figure 4C:
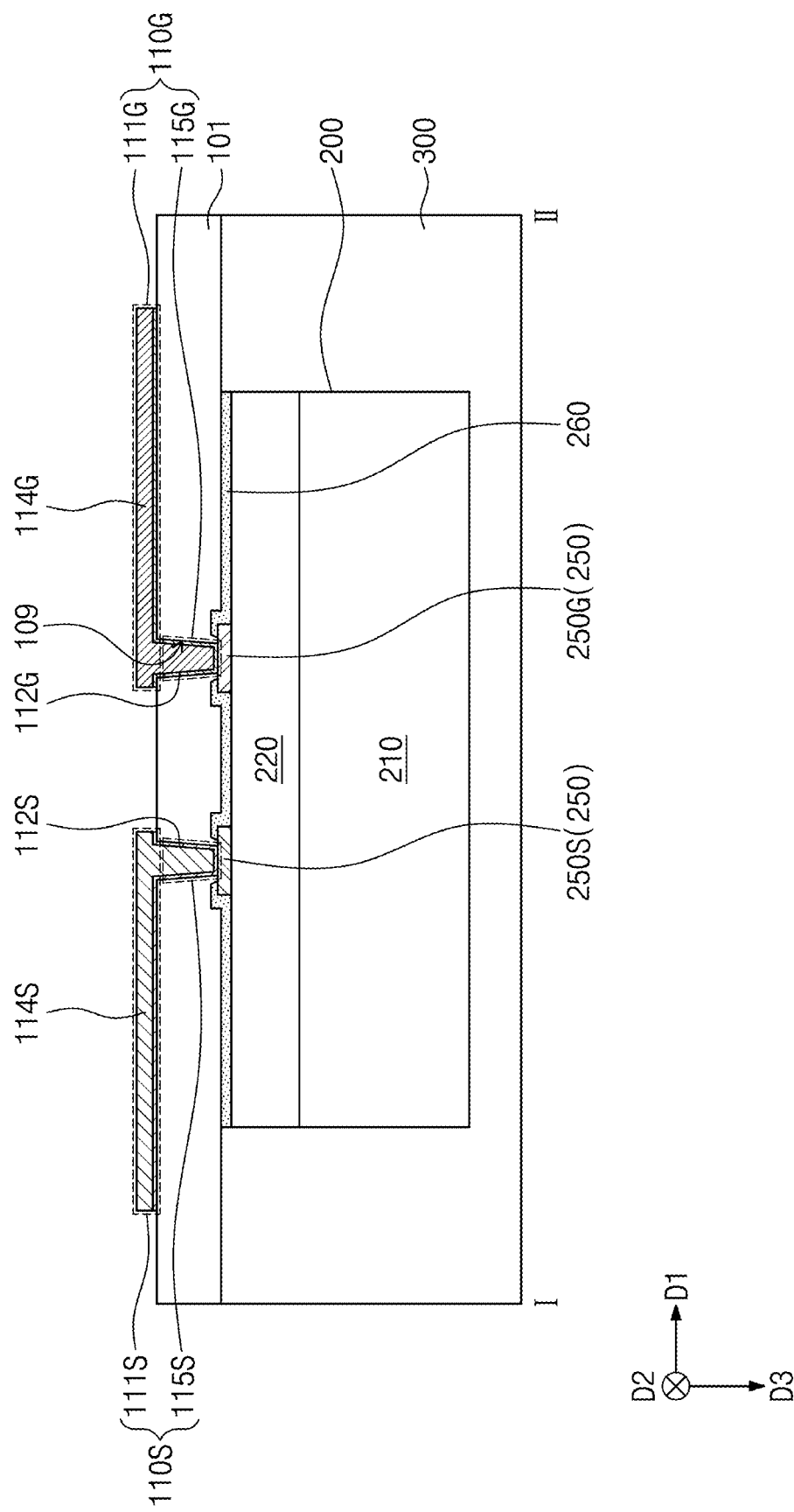
Figure 4D:
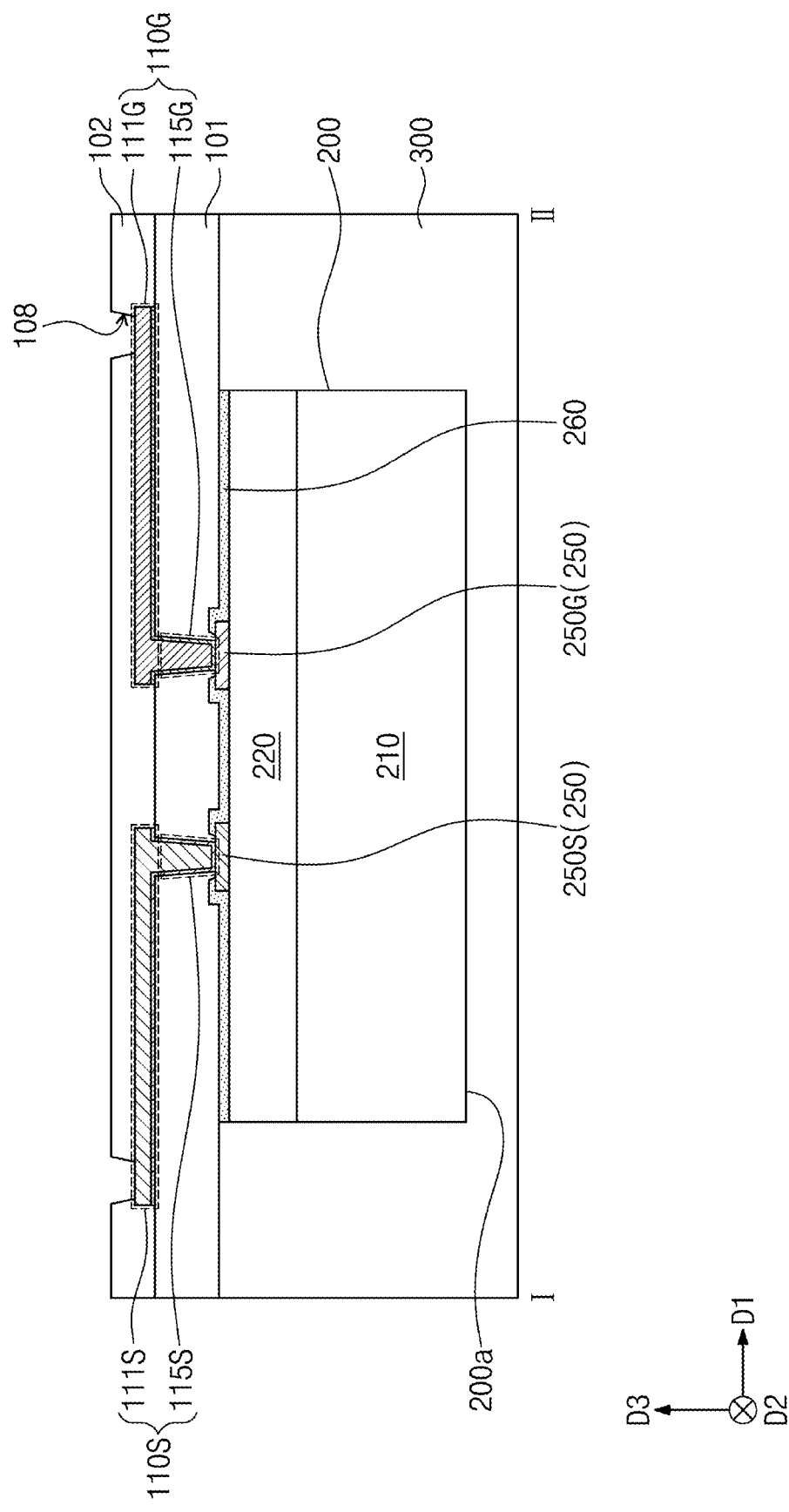
Figure 4E:
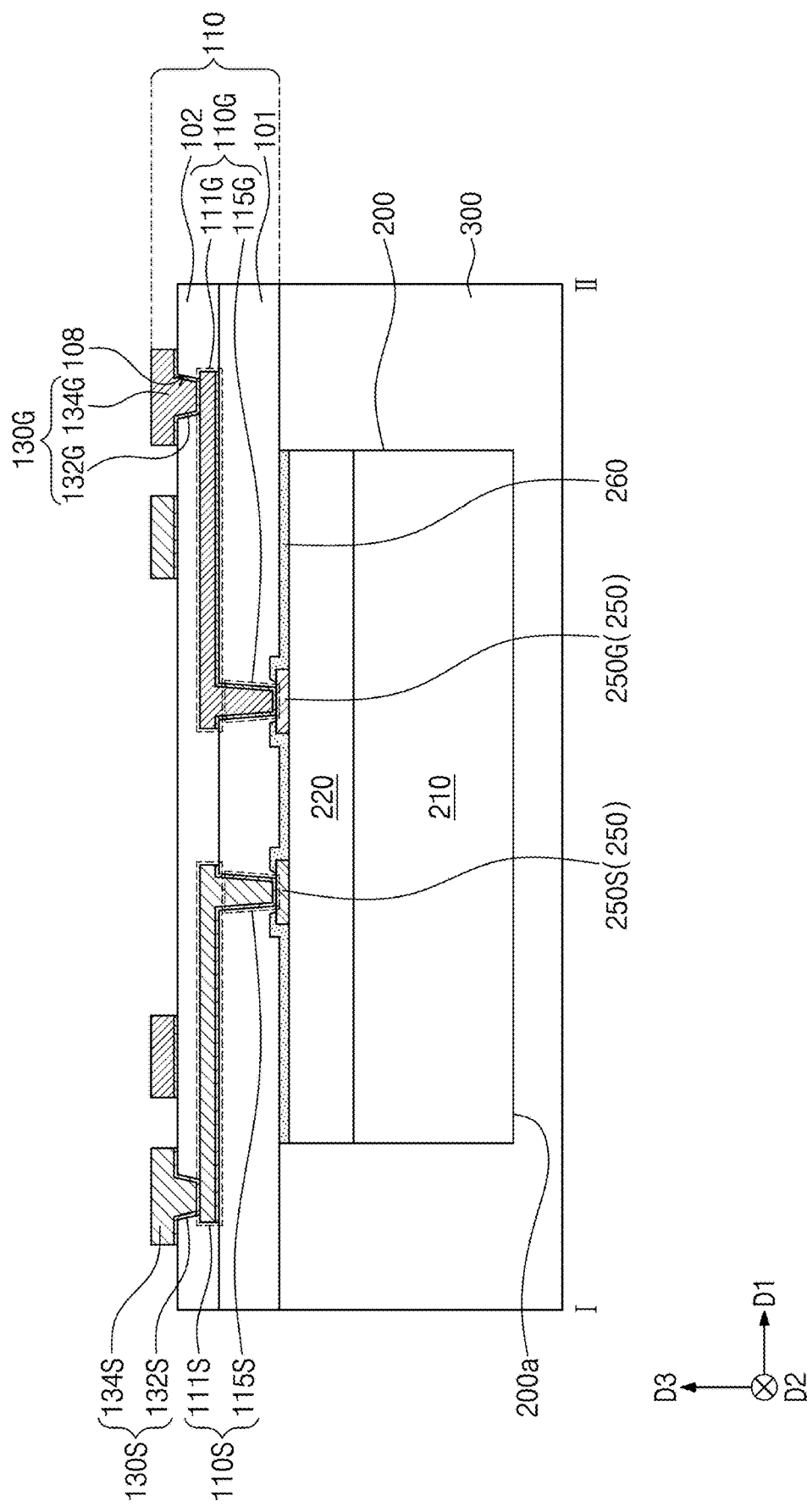

FIGS. 4A to 4E illustrate cross-sectional views taken along line I-II of FIG. 1A, showing a method of fabricating a semiconductor package according to some example embodiments. The following description will refer to FIG. 1A together with FIGS. 4A to 4E, and a duplicate explanation will be omitted. In the description of FIGS. 4A and 4E, top and bottom surfaces of a certain component will be determined based on drawings related to the explanation thereof.

Referring to FIG. 4A, a semiconductor chip 200 and a molding layer 300 may be disposed on a carrier substrate 990. The semiconductor chip 200 may include a semiconductor substrate 210, a circuit layer 220, chip pads 250, and a passivation layer 260. In this step, the chip pads 250 of the semiconductor chip 200 may face the carrier substrate 990. A carrier adhesive layer 980 may be interposed between the carrier substrate 990 and the semiconductor chip 200 and between the carrier substrate 990 and the molding layer 300.

The molding layer 300 may be formed on the carrier substrate 990, and may cover at least a portion of the semiconductor chip 200. For example, the molding layer 300 may cover a top surface 200a and a lateral surface of the semiconductor chip 200. Differently from that shown, the molding layer 300 may cover the lateral surface of the semiconductor chip 200, but may expose the top surface 200a of the semiconductor chip 200. The molding layer 300 may have a bottom surface at substantially the same level as that of a bottom surface of the passivation layer 260. Afterwards, the carrier adhesive layer 980 and the carrier substrate 990 may be removed to expose a bottom surface of the semiconductor chip 200. The bottom surface of the semiconductor chip 200 may correspond to that of the passivation layer 260 and those of the chip pads 250.

Referring to FIG. 4B, the semiconductor chip 200 may be turned upside down to allow the chip pads 250 to face upwards. A first organic dielectric layer 101 may be formed on and may cover the semiconductor chip 200 and the molding layer 300. For example, the first organic dielectric layer 101 may cover the passivation layer 260 and the chip pads 250. The formation of the first organic dielectric layer 101 may include coating a photosensitive polymer. The coating of the photosensitive polymer may be performed by spin coating or slit coating.

First openings 109 may be formed in the first organic dielectric layer 101 to expose the chip pads 250. The formation of the first openings 109 may be performed by a patterning process that includes an exposure process and a development process.

Referring to FIG. 4C, conductive patterns 110S and 110G may be formed on the first organic dielectric layer 101, and may be coupled to corresponding chip pads 250. The conductive patterns 110S and 110G may include a signal conductive pattern 110S and a ground/power conductive pattern 110G. The signal conductive pattern 110S may extend into a corresponding first opening 109, and may be coupled to a first chip pad 250S. The ground/power conductive pattern 110G may extend into a corresponding first opening 109, and may be coupled to a second chip pad 250G.

The formation of the conductive patterns 110S and 110G may include forming a preliminary seed layer in the first openings 109 and on the first organic dielectric layer 101, forming on the preliminary seed layer a first resist pattern that has first guide openings, performing an electroplating process in which the preliminary seed layer is used as an electrode, removing the first resist pattern to expose a portion of the preliminary seed layer, and etching the exposed portion of the preliminary seed layer. The first guide openings may be spatially connected to corresponding first openings 109. The electroplating process may form a first conductive layer 114S in a corresponding first opening 109, and may also form a second conductive layer 114G in a corresponding first opening 109. The first and second conductive layers 114S and 114G may fill lower portions of the first guide openings that correspond thereto. The first and second conductive layers 114S and 114G may be spaced apart from each other. The etching of the preliminary seed layer may form a first seed pattern 112S and a second seed pattern 112G that are spaced apart from each other. Therefore, the signal conductive pattern 110S and the ground/power conductive pattern 110G may be formed. The signal conductive pattern 110S may include the first seed pattern 112S and the first conductive layer 114S. The ground/power conductive pattern 110G may include the second seed pattern 112G and the second conductive layer 114G. The second seed pattern 112G and the first seed pattern 112S may be formed in a single process. The second conductive layer 114G and the first conductive layer 114S may be formed in a single process.

The signal conductive pattern 110S may include a signal via part 115S and a signal redistribution pattern 111S. The ground/power conductive pattern 110G may include a ground/power via part 115G and a ground/power redistribution pattern 111G.

Referring to FIG. 4D, a second organic dielectric layer 102 may be formed on the first organic dielectric layer 101, and may cover the signal conductive pattern 110S and the ground/power conductive pattern 110G. The formation of the second organic dielectric layer 102 may include coating a photosensitive polymer.

Second openings 108 may be formed in the second organic dielectric layer 102 to expose the conductive patterns 110S and 110G. For example, the second openings 108 may expose the signal redistribution pattern 111S and the ground/power redistribution pattern 111G. The formation of the second openings 108 may be performed by a patterning process that includes an exposure process and a development process.

Referring to FIG. 4E, redistribution pads 130S and 130G may be formed on the second organic dielectric layer 102, and may be respectively coupled to the conductive patterns 110S and 110G. The redistribution pads 130S and 130G may include a signal redistribution pad 130S and a ground/power redistribution pad 130G. The signal redistribution pad 130S may extend into a corresponding second opening 108, and may be coupled to the signal redistribution pattern 111S. The ground/power redistribution pad 130G may extend into a corresponding second opening 108, and may be coupled to the ground/power redistribution pattern 111G.

The formation of the redistribution pads 130S and 130G may include forming a seed layer in the second openings 108 and on the second organic dielectric layer 102, forming on the seed layer a second resist pattern that has second guide openings, performing an electroplating process in which the seed layer is used as an electrode, removing the second resist pattern to expose a portion of the seed layer, and etching the exposed portion of the seed layer. The second guide openings may be spatially connected to corresponding second openings 108. The electroplating process may form a first conductive pad 134S in a corresponding second opening 108, and may also form a second conductive pad 134G in a corresponding second opening 108. The first conductive pad 134S and the second conductive pad 134G may fill lower portions of the second guide openings that correspond thereto. The first conductive pad 134S and the second conductive pad 134G may be spaced apart from each other. The etching of the seed layer may form a first pad seed pattern 132S and a second pad seed pattern 132G that are spaced apart from each other. Therefore, the signal redistribution pad 130S and the ground/power redistribution pad 130G may be formed. The signal redistribution pad 130S and the ground/power redistribution pad 130G may be electrically isolated from each other. The signal redistribution pad 130S may include the first pad seed pattern 132S and the first conductive pad 134S. The ground/power redistribution pad 130G may include the second pad seed pattern 132G and the second conductive pad 134G. The processed mentioned above may manufacture a redistribution substrate 100. The redistribution substrate 100 may include the first organic dielectric layer 101, the second organic dielectric layer 102, the conductive patterns 110S and 110G, and the redistribution pads 130S and 130G.

Referring back to FIG. 1B, the redistribution substrate 100, the semiconductor chip 200, and the molding layer 300 may be turned upside down. Solder patterns 500S and 500G may be respectively formed on and coupled to the redistribution pads 130S and 130G. The formation of the solder patterns 500S and 500G may be performed before or after the turning of the redistribution substrate 100, the semiconductor chip 200, and the molding layer 300. Accordingly, a semiconductor package 1 may be fabricated as shown in FIGS. 1A to 1D.

Figure 5A:
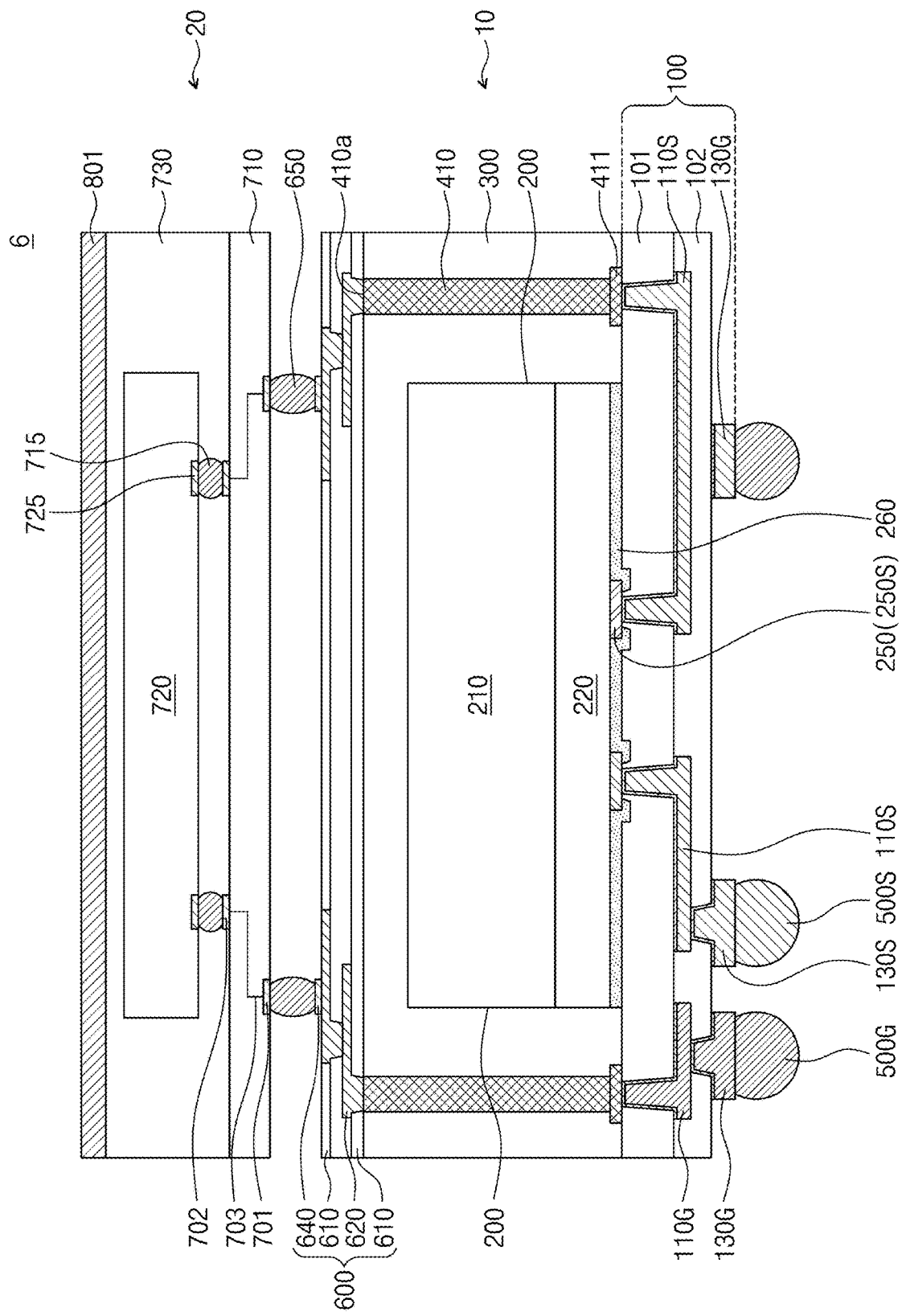
FIG. 5A illustrates a cross-sectional view showing a semiconductor package according to some example embodiments.

FIG. 5A illustrates a cross-sectional view showing a semiconductor package according to some example embodiments.

Referring to FIG. 5A, a semiconductor package 6 may include a lower package 10 and an upper package 20. The lower package 10 may include a redistribution substrate 100, solder patterns 500S and 500G, a semiconductor chip 200, a molding layer 300, and one or more conductive structures 410. The redistribution substrate 100, the semiconductor chip 200, the solder patterns 500S and 500G, and the molding layer 300 may be substantially the same as those discussed in the example of FIGS. 1A to 1D, in the example of FIG. 2A, or in the example of FIG. 2B.

The semiconductor chip 200 may include a logic chip, a memory chip, or a power management chip. The logic chip may include an applicant specific integrated circuit (ASIC) chip or an application processor (AP) chip. The ASIC chip may include an application specific integrated circuit (ASIC). The power management chip may include a power management integrated circuit (PMIC). Differently from that shown, the semiconductor chip 200 may include a plurality of semiconductor chips 200 that are disposed laterally spaced apart from each other. In this case, one of the semiconductor chips 200 may be a logic chip, and another of the semiconductor chips 200 may be a power management chip. The following will discuss a single semiconductor chip 200.

The conductive structure 410 may be disposed on a top surface of the redistribution substrate 100, and may be coupled to a corresponding one of the conductive patterns 110S and 110G. A first metal pad 411 may further be interposed between the conductive structure 410 and the corresponding one of the conductive patterns 110S and 110G. The conductive structure 410 may be disposed laterally spaced apart from the semiconductor chip 200. When viewed in plan, the conductive structure 410 may be provided on an edge region of the redistribution substrate 100. A metal pillar may be provided on the redistribution substrate 100, forming the conductive structure 410. For example, the conductive structure 410 may be a metal pillar. The conductive structures 410 may be electrically connected through the redistribution substrate 100 to the semiconductor chip 200 or the solder patterns 500S and 500G. The conductive structure 410 may include metal, such as copper. In this description, the phrase "electrically connected to the redistribution substrate 100" may mean "electrically connected to at least one of the conductive patterns 110S and 110G and the redistribution pads 130S and 130G."

The molding layer 300 may be disposed on the top surface of the redistribution substrate 100, and may cover the semiconductor chip 200. The molding layer 300 may encapsulate sidewalls of the conductive structure 410. The molding layer 300 may have a sidewall aligned with that of the redistribution substrate 100. The molding layer 300 may expose a top surface 410a of the conductive structure 410.

The lower package 10 may further include an upper redistribution layer 600. The upper redistribution layer 600 may be provided on a top surface of the molding layer 300. The upper redistribution layer 600 may include upper organic dielectric layers 610, metal patterns 620, and upper bonding pads 640. The upper organic dielectric layers 610 may be stacked on the molding layer 300. The upper organic dielectric layers 610 may include a photosensitive polymer.

Each of the metal patterns 620 may include a via part in the upper organic dielectric layers 610 and a line part between the upper organic dielectric layers 610. The metal patterns 620 may include, for example, copper, titanium, or an alloy thereof. At least one of the metal patterns 620 may be in contact with the top surface 410a of the conductive structure 410. The upper bonding pads 640 may be disposed on an uppermost one of the upper organic dielectric layers 610 and may be coupled to the metal patterns 620. The upper bonding pads 640 may be electrically connected through the metal patterns 620 and the conductive structures 410 to the solder patterns 500S and 500G or the semiconductor chip 200. Because the metal patterns 620 are provided, the upper bonding pad 640 may not be vertically aligned with the conductive structure 410.

The upper package 20 may be disposed on the lower package 10. For example, the upper package 20 may be placed on the upper redistribution layer 600. The upper package 20 may include an upper substrate 710, an upper semiconductor chip 720, and an upper molding layer 730. The upper substrate 710 may be a printed circuit board or a redistribution layer. A first connection pad 701 and a second connection pad 702 may be respectively disposed on a bottom surface and a top surface of the upper substrate 710. The upper substrate 710 may be provided therein with a wiring line 703 coupled to the first connection pad 701 and the second connection pad 702. The wiring line 703 is schematically illustrated, and may be variously changed in shape and arrangement. The first connection pad 701, the second connection pad 702, and the wiring line 703 may include a conductive material, such as metal.

The upper semiconductor chip 720 may be disposed on the upper substrate 710. The upper semiconductor chip 720 may include integrated circuits (not shown), and the integrated circuits may include a memory circuit, a logic circuit, or a combination thereof. The upper semiconductor chip 720 may be of a different type from that of the semiconductor chip 200. For example, the upper semiconductor chip 720 may be a memory chip. A bump terminal 715 may be interposed between the upper substrate 710 and the upper semiconductor chip 720, and may be coupled to the second connection pad 702 and a chip pad 725 of the upper semiconductor chip 720. Differently from that shown, the bump terminal 715 may be omitted, and the chip pad 725 may be directly coupled to the second connection pad 702.

The upper molding layer 730 may be provided on the upper substrate 710, and may cover the upper semiconductor chip 720. The upper molding layer 730 may include a dielectric polymer, such as an epoxy-based polymer.

The upper package 20 may further include an upper thermal radiation plate 801. The upper thermal radiation plate 801 may include a heat sink, a heat slug, or a thermal interface material (TIM) layer. The upper thermal radiation plate 801 may include, for example, metal. The upper thermal radiation plate 801 may be disposed on a top surface of the upper molding layer 730. The upper thermal radiation plate 801 may further extend onto a sidewall of the upper molding layer 730 or a sidewall of the molding layer 300.

The semiconductor package 6 may further include a connection terminal 650. The connection terminal 650 may be interposed between and coupled to the upper bonding pad 640 and the first connection pad 701. Therefore, the upper package 20 may be electrically connected through a plurality of connection terminals 650 to the semiconductor chip 200 and/or the solder patterns 500S and 500G. The connection terminal 650 may include a solder, a bump, or a combination thereof. The connection terminal 650 may include a solder material. An electrical connection with the upper package 20 may mean an electrical connection with integrated circuits in the upper semiconductor chip 720.

Alternatively, the upper substrate 710 and the bump terminal 715 may be omitted, and the connection terminal 650 may be directly coupled to the chip pad 725 of the upper semiconductor chip 720. In this case, the upper molding layer 730 may be in direct contact with a top surface of the upper redistribution layer 600. Dissimilarly, the upper substrate 710, the bump terminal 715, and the connection terminal 650 may be omitted, and the chip pad 725 of the upper semiconductor chip 720 may be directly coupled to the upper bonding pad 640.

Figure 5B:
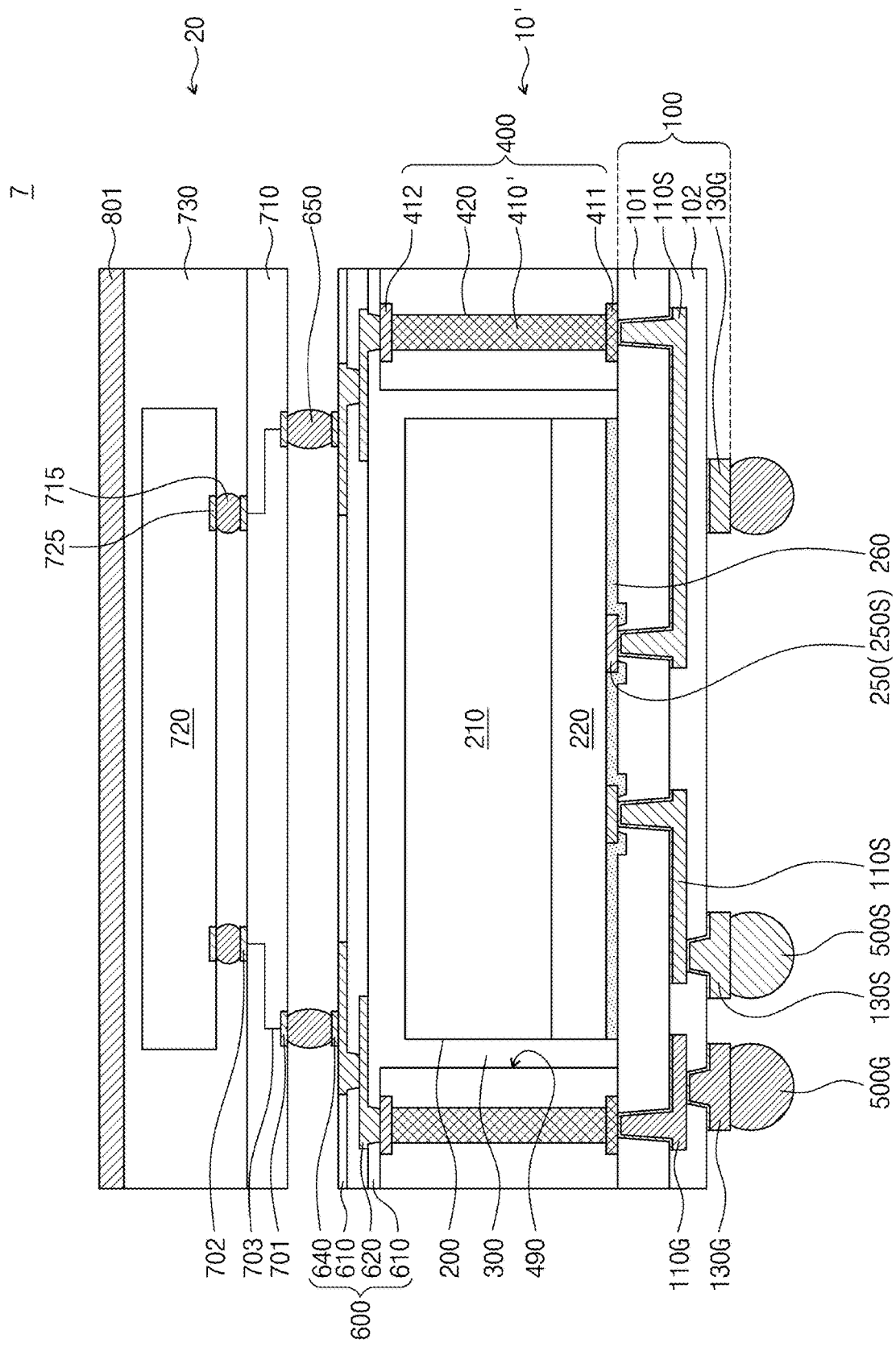
FIG. 5B illustrates a cross-sectional view showing a semiconductor package according to some example embodiments.

FIG. 5B illustrates a cross-sectional view showing a semiconductor package according to some example embodiments.

Referring to FIG. 5B, a semiconductor package 7 may include a lower package 10' and an upper package 20. The lower package 10' may include a redistribution substrate 100, solder patterns 500S and 500G, a semiconductor chip 200, a molding layer 300, and a connection substrate 400.

The connection substrate 400 may be disposed on the redistribution substrate 100. The connection substrate 400 may have a substrate hole 490 that penetrates therethrough. For example, the substrate hole 490 may be formed to penetrate top and bottom surfaces of a printed circuit board, which may manufacture the connection substrate 400. When viewed in plan, the substrate hole 490 may be formed on a central portion of the connection substrate 400. The semiconductor chip 200 may be disposed in the substrate hole 490 of the connection substrate 400. The semiconductor chip 200 may be disposed spaced apart from an inner wall of the connection substrate 400.

The connection substrate 400 may include a base layer 420 and a conductive structure 410'. Although not shown, the base layer 420 may include a plurality of stacked layers. The base layer 420 may include a dielectric material. For example, the base layer 420 may include a carbon-based material, a ceramic, or a polymer. The substrate hole 490 may penetrate the base layer 420. The conductive structure 410' may be provided in the base layer 420. The connection substrate 400 may further include a first metal pad 411 and a second metal pad 412. The first metal pad 411 may be disposed on a bottom surface of the conductive structure 410'. The second metal pad 412 may be disposed on a top surface of the conductive structure 410'. The second metal pad 412 may be electrically connected through the conductive structure 410' to the first metal pad 411. The conductive structure 410', the first metal pad 411, and the second metal pad 412 may include, for example, at least one selected from copper, aluminum, tungsten, titanium, tantalum, and any alloy thereof.

The molding layer 300 may be provided on the semiconductor chip 200 and the connection substrate 400. The molding layer 300 may be interposed between the semiconductor chip 200 and the connection substrate 400, and may cover at least a portion of the top surface of the redistribution substrate 100. According to some example, embodiments, an adhesive dielectric film may be attached to a top surface of the connection substrate 400, a top surface of the semiconductor chip 200, and sidewalls of the semiconductor chip 200, forming the molding layer 300. For example, an Ajinomoto build-up film (ABF) may be used as the adhesive dielectric film. For another example, the molding layer 300 may include a dielectric polymer, such as epoxy-based polymer.

The lower package 10' may further include an upper redistribution layer 600. The upper redistribution layer 600 may be disposed on the molding layer 300 and the connection substrate 400. The upper redistribution layer 600 may include upper organic dielectric layers 610, metal patterns 620, and upper bonding pads 640. The upper organic dielectric layers 610, the metal patterns 620, and the upper bonding pads 640 may be substantially the same as those discussed in the example of FIG. 5A. In contrast, at least one of the metal patterns 620 may extend into the molding layer 300, and may be coupled to the second metal pad 412.

Alternatively, the lower package 10' may be fabricated by using the redistribution substrate 100 discussed in the example of FIG. 1E or the redistribution substrate 100 discussed in the example of FIG. 2A. In other embodiments, the semiconductor chip 200 may not include the passivation layer 260, and the circuit layer 220 of the semiconductor chip 200 may be directly in physical contact with the redistribution substrate 100.

The upper package 20 may be disposed on the lower package 10'. For example, the upper package 20 may be placed on the upper redistribution layer 600. The upper package 20 may include an upper substrate 710, an upper semiconductor chip 720, and an upper molding layer 730. The upper package 20 may further include an upper thermal radiation plate 801. A connection terminal 650 may further be interposed between the lower package 10' and the upper package 20. The upper package 20 and the connection terminal 650 may be substantially the same as those discussed in FIG. 5A.

The embodiments of inventive concepts may be combined with each other. For example, at least two of the embodiments of FIGS. 1A to 1D, FIG. 1E, FIG. 2A, FIG. 2B, FIG. 2C, FIG. 3, FIG. 5A, and FIG. 5B may be combined with each other.

Figure 6:
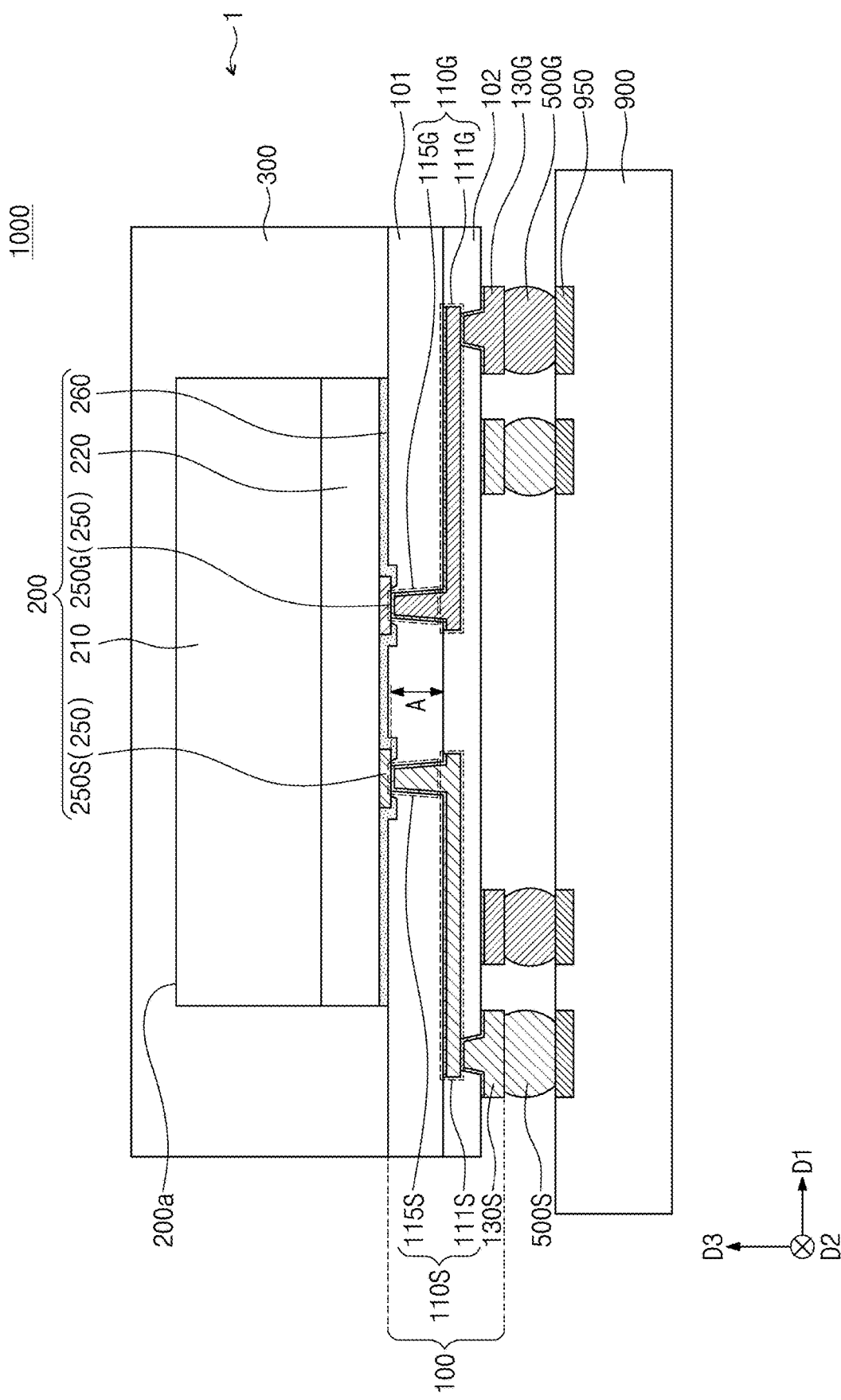
FIG. 6 illustrates a semiconductor module according to some example embodiments.

FIG. 6 illustrates a semiconductor module according to some example embodiments.

Referring to FIG. 6, a semiconductor module 1000 may include a board 900 and a semiconductor package 1. The board 900 may be a printed circuit board. The board 900 may have module pads 950 provided on a top surface thereof. The module pads 950 may include a conductive material, such as metal.

The semiconductor package 1 may be mounted on the board 900. The mounting of the semiconductor package 1 may include coupling the solder patterns 500S and 500G to corresponding module pads 950. The semiconductor chip 200 may be electrically connected through the solder patterns 500S and 500G to the board 900. The semiconductor package 1 may be the same as that discussed in the example of FIGS. 1A to 1D. Alternatively, instead of the example shown in FIG. 6, the board 900 may be provided thereon with the semiconductor package 2 of FIG. 2A, the semiconductor package 3 of FIG. 2B, the semiconductor package 4 of FIG. 2C, the semiconductor package 5 of FIG. 3, the semiconductor package 6 of FIG. 5A, or the semiconductor package 7 of FIG. 5B.

According to some example embodiments, the vertical distance A between the chip pads 250 and the signal redistribution patterns 111S may be greater than the width (see W1 of FIG. 1A) of the signal redistribution patterns 111S. Therefore, a difference in impedance may be reduced between the semiconductor package 1 and the board 900. The semiconductor module 1000 may improve in electrical characteristics.

According to inventive concepts, a vertical distance between chip pads and signal redistribution patterns may be greater than a width of the signal redistribution patterns. Accordingly, a semiconductor module may improve in electrical characteristics.

An interval between the signal redistribution patterns may be greater than a width of the signal redistribution pattern. Signal interference may be suppressed or avoided between the signal redistribution patterns. When viewed in plan, each of the signal redistribution patterns may be spaced apart from lower redistribution patterns that are electrically isolated therefrom, and thus signal interference may be suppressed or avoided between the signal redistribution patterns and the lower signal redistribution patterns. A semiconductor package may exhibit increased reliability and improved electrical characteristics.

While some embodiments of inventive concepts have been described, inventive concepts are not limited to the embodiments described above, and it will be understood by one of ordinary skill in the art that variations in form and detail may be made therein without departing from the spirit and scope of inventive concepts.

What is claimed is:

1. A semiconductor package, comprising:
a semiconductor chip including a chip pad on one surface of the semiconductor chip;
a redistribution pattern on the one surface of the semiconductor chip and electrically connected to the chip pad, the redistribution pattern includes a signal redistribution pattern, a ground redistribution pattern, and a power redistribution pattern;
a ground redistribution pad electrically connected to the ground redistribution pattern; and
a photosensitive dielectric layer between the semiconductor chip and the redistribution pattern, the photosensitive dielectric layer being in physical contact with the redistribution pattern, wherein
a vertical distance between the chip pad and the signal redistribution pattern is greater than a width of the signal redistribution pattern, the width of the signal redistribution pattern being in plan view from a first side surface of the signal redistribution pattern to a second side surface of the signal redistribution pattern, the second side surface of the signal redistribution pattern being opposite the first side surface of the signal redistribution pattern,
the signal redistribution pattern vertically overlaps the ground redistribution pad,
the vertical distance between the chip pad and the signal redistribution pattern is in a cross-sectional view,
the signal redistribution pattern vertically overlaps the ground redistribution pad in the cross-sectional view, and
the vertical direction extends perpendicular to the one surface of the semiconductor chip.

2. The semiconductor package of claim 1, further comprising:
a first signal redistribution pad coupled to the signal redistribution pattern; and
a plurality of second signal redistribution pads electrically isolated from the signal redistribution pattern, wherein
the photosensitive dielectric layer is on the plurality of second signal redistribution pads, and
the signal redistribution pattern does not vertically overlap the plurality of second signal redistribution pads.

3. The semiconductor package of claim 1, wherein
the photosensitive dielectric layer includes a first photosensitive dielectric layer and a second photosensitive dielectric layer, the first photosensitive dielectric layer is between the semiconductor chip and the signal redistribution pattern, the second photosensitive dielectric layer is on a bottom surface of the first photosensitive dielectric layer and a bottom surface of the redistribution pattern, and a thickness of the first photosensitive dielectric layer is greater than the width of the signal redistribution pattern.

4. The semiconductor package of claim 1, wherein the signal redistribution pattern includes a plurality of signal redistribution patterns that are laterally spaced apart from each other, and an interval between the signal redistribution patterns is about 10 times to about 15 times of the width of the signal redistribution patterns.

5. The semiconductor package of claim 1, wherein a width of the ground redistribution pattern is different from the width of the signal redistribution pattern.

6. The semiconductor package of claim 1, further comprising:

a redistribution pad on a bottom surface of the redistribution pattern and electrically connected to the redistribution pattern; and a molding layer that covers a sidewall of the semiconductor chip, wherein the photosensitive dielectric layer and the redistribution pad are on a bottom surface of the molding layer.

7. The semiconductor package of claim 1, wherein the signal redistribution pattern includes a first signal redistribution pattern and a second signal redistribution pattern, and an extending length of the second signal redistribution pattern is about 95% to about 105% of an extending length of the first signal redistribution pattern.

8. The semiconductor package of claim 1, wherein the semiconductor chip further includes a passivation layer on the one surface, the passivation layer exposes the chip pad, the passivation layer includes a material different from a material of the photosensitive dielectric layer, and the chip pad includes a metal different from a metal of the redistribution pattern.

9. The semiconductor package of claim 1, wherein the redistribution pattern further includes a conductive layer and a seed pattern, the seed pattern is between the conductive layer and the photosensitive dielectric layer and between the chip pad and the photosensitive dielectric layer, and a thickness of the seed pattern is less than a thickness of the conductive layer.

10. The semiconductor package of claim 1, wherein the signal redistribution pattern has a major axis parallel to a first direction when viewed in plan, the width of the signal redistribution pattern is a width in a direction parallel to a second direction, and the second direction is substantially orthogonal to the first direction.

11. The semiconductor package of claim 1, wherein the width of the signal redistribution pattern is a maximum width in plan view from the first side surface of the signal redistribution pattern to the second side surface of the signal redistribution pattern.

12. The semiconductor package of claim 1, wherein the photosensitive dielectric layer has a thickness in a vertical direction, the thickness being between the semiconductor chip and the signal redistribution pattern and the thickness is greater than the width of the redistribution pattern.

13. The semiconductor package of claim 1, wherein the photosensitive dielectric layer contacts the semiconductor chip.

14. The semiconductor package of claim 13, wherein the photosensitive dielectric layer directly contacts the semiconductor chip.

15. A semiconductor package, comprising:

a semiconductor chip including a plurality of chip pads on one surface of the semiconductor chip;

a plurality of upper redistribution patterns on the one surface of the semiconductor chip and electrically connected to corresponding chip pads among the plurality of chip pads, lengths of the plurality of upper redistribution patterns extending in a direction parallel to the one surface of the semiconductor chip, and the lengths of the plurality of upper redistribution patterns being greater than widths of the plurality of upper redistribution patterns, the widths being in an other direction parallel to the one surface of the semiconductor chip;

a photosensitive dielectric layer on the one surface of the semiconductor chip and covering the plurality of upper redistribution patterns; and a plurality of lower redistribution patterns on bottom surfaces of corresponding ones of the plurality of upper redistribution patterns and electrically connected to the corresponding ones of the plurality of upper redistribution patterns, wherein the plurality of upper redistribution patterns include a first signal redistribution pattern and a second signal redistribution pattern that are electrically isolated from each other, the plurality of lower redistribution patterns include a first lower signal redistribution pattern coupled to the first signal redistribution pattern and a plurality of second lower signal redistribution patterns insulated from the first signal redistribution pattern, when viewed in plan, the first signal redistribution pattern is spaced apart from the second lower signal redistribution patterns, the plurality of lower redistribution patterns further include a lower ground/power redistribution pattern, the first signal redistribution pattern vertically overlaps the lower ground/power redistribution pattern, and the vertical direction extends perpendicular to the one surface of the semiconductor chip.

16. The semiconductor package of claim 15, wherein the plurality of upper redistribution patterns further include a ground/power redistribution pattern, and the ground/power redistribution pattern vertically overlaps the second lower signal redistribution patterns.

17. A semiconductor package, comprising:

a semiconductor substrate;

a circuit layer on one surface of the semiconductor substrate, the circuit layer including a plurality of integrated circuits, a plurality of silicon-based dielectric layers, and a plurality of wiring structures;

a plurality of chip pads on the circuit layer and electrically connected through the plurality of wiring structures to the plurality of integrated circuits;

a plurality of redistribution patterns on the circuit layer and electrically connected to corresponding ones of the plurality of chip pads;

a photosensitive dielectric layer on the circuit layer and covering at least a portion of each of the plurality of redistribution patterns;

a plurality of redistribution pads on the photosensitive dielectric layer and coupled to corresponding ones of the plurality of redistribution patterns; and a plurality of solder patterns on bottom surfaces of corresponding ones of the plurality of redistribution pads and coupled to the corresponding ones of the plurality of redistribution pads, wherein the plurality of redistribution patterns include a plurality of signal redistribution patterns, a ground redistribution pattern, and a power redistribution pattern, the plurality of redistribution pads include a plurality of signal redistribution pads, a ground redistribution pad, and a power redistribution pad, the plurality of signal redistribution pads are coupled to the plurality of signal redistribution patterns, the ground redistribution pad is coupled to the ground redistribution pattern, the power redistribution pad is coupled to the power redistribution pattern, the photosensitive dielectric layer includes a photosensitive polymer, and when viewed in plan, an interval between the plurality of signal redistribution patterns is about 10 times to about 15 times a width of the plurality of signal redistribution patterns, and a difference in level between bottom surfaces of the plurality of chip pads and top surfaces of the plurality of signal redistribution patterns is greater than the width of the plurality of signal redistribution patterns, the width of the signal redistribution patterns being in plan view from a first side surface of the signal redistribution patterns to a second side surface of the signal redistribution patterns, the second side surface of the signal redistribution patterns being opposite the first side surface of the signal redistribution patterns, the signal redistribution pattern overlaps the ground redistribution pad in a vertical direction, and the vertical direction extends perpendicular to the one surface of the semiconductor substrate.

\* \* \* \* \*